(12) United States Patent
Desplats et al.

(10) Patent No.: US 7,190,822 B2
(45) Date of Patent: Mar. 13, 2007

(54) METHOD FOR CUSTOMIZING AN INTEGRATED CIRCUIT ELEMENT

(75) Inventors: Romain Desplats, Toulouse (FR); Philippe Perdu, Toulouse (FR)

(73) Assignee: Centre National d'Etudes Spatiales, Paris (FR)

( * ) Notice: Subject to any disclaimer, the term of this patent is extended or adjusted under 35 U.S.C. 154(b) by 692 days.

(21) Appl. No.: 10/312,632

(22) PCT Filed: Jun. 26, 2001

(86) PCT No.: PCT/FR01/02024

§ 371 (c)(1),
(2), (4) Date: Apr. 2, 2003

(87) PCT Pub. No.: WO02/01239

PCT Pub. Date: Jan. 3, 2002

(65) Prior Publication Data

US 2003/0174171 A1    Sep. 18, 2003

(30) Foreign Application Priority Data

Jun. 28, 2000 (FR) .................................. 00 08337

(51) Int. Cl.
  *G06K 9/00*  (2006.01)
(52) U.S. Cl. ........................ 382/145; 348/126; 714/724
(58) Field of Classification Search ...................... None
  See application file for complete search history.

(56) References Cited

U.S. PATENT DOCUMENTS 5,570,376 A * 10/1996 Kunda et al. ................ 714/736

(Continued)

FOREIGN PATENT DOCUMENTS

FR    2 786 011    5/2000

(Continued)

OTHER PUBLICATIONS

J D Russell et al., "E-Beam Testing Using Multiple Adjacent Image Processing for Prototype Validation", Microelectronic Engineering, NL, Elsevier Publishers BV., Amsterdam vol. 16, No. 1/04, Mar. 1, 1992, pp. 413-420, XP000245368 ISSN: 0167-9317 le document en entier.

(Continued)

*Primary Examiner*—Samir Ahmed
*Assistant Examiner*—Charles Kim
(74) *Attorney, Agent, or Firm*—Young & Thompson

(57) ABSTRACT

A customizing method includes steps which consist in: a) determining on the basis of a circuit model, a set of vectors each corresponding to a theoretical operating time of the circuit when a predetermined sequence of tests is applied, the coefficients of each vector representing the state of a common set of elements of the circuit among which the element to be customized (12); b) defining on the basis of a comparison of vectors, a composite of logic operators applied on the vectors and enabling to extract the coefficient corresponding to the element to be customized (30); c) producing images of the operating circuit at times corresponding to the vectors whereon is applied the composite of logic operators (32); and d) graphically combining the images produced in accordance with a composite of graphic operators corresponding to the composite of logic operators (36).

7 Claims, 19 Drawing Sheets

U.S. PATENT DOCUMENTS 5,703,492 A * 12/1997 Nakamura et al. .......... 324/751
5,790,565 A * 8/1998 Sakaguchi ................. 714/738

FOREIGN PATENT DOCUMENTS

| GB | 924 432 | | 4/1963 |
|----|---------|---|--------|
| WO | WO 00/29953 | * | 5/2000 |

OTHER PUBLICATIONS

K. Nikawa et al., "VLSI Fault Localization Using Electron Beam Voltage Contrast Image.O-Novel Image Acquisition and Localization Method." Japanese Journal of Applied Physics, JP, Publication Office Japanese Journal of Applied Physics. Tokyo, vol. 31, No. 12B, Part 01, Dec. 1, 1992, pp. 4525-4530. XP000415470, ISSN: 0021-4922 le document en entier.

* cited by examiner

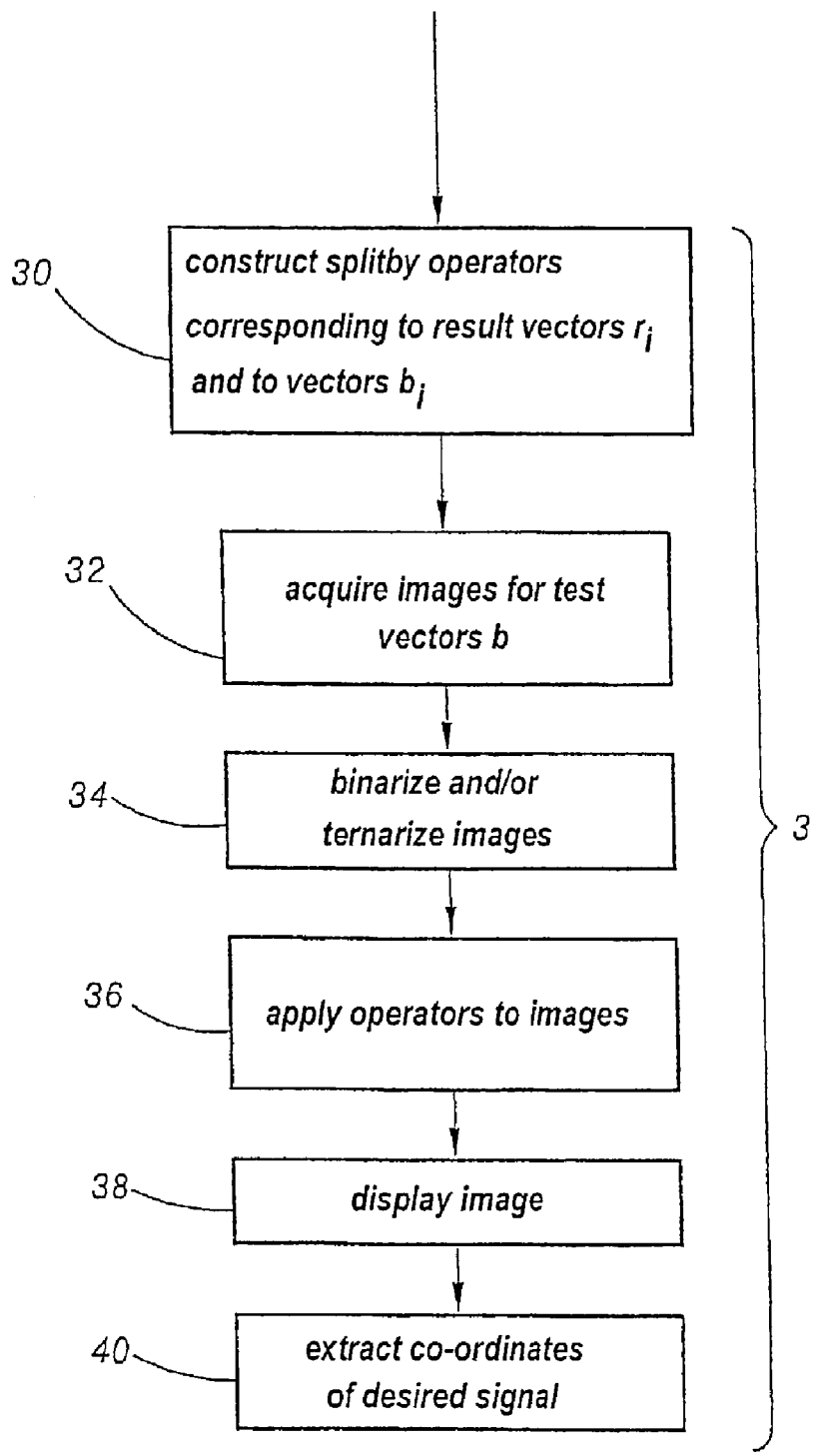
FIG.1 contined and ended

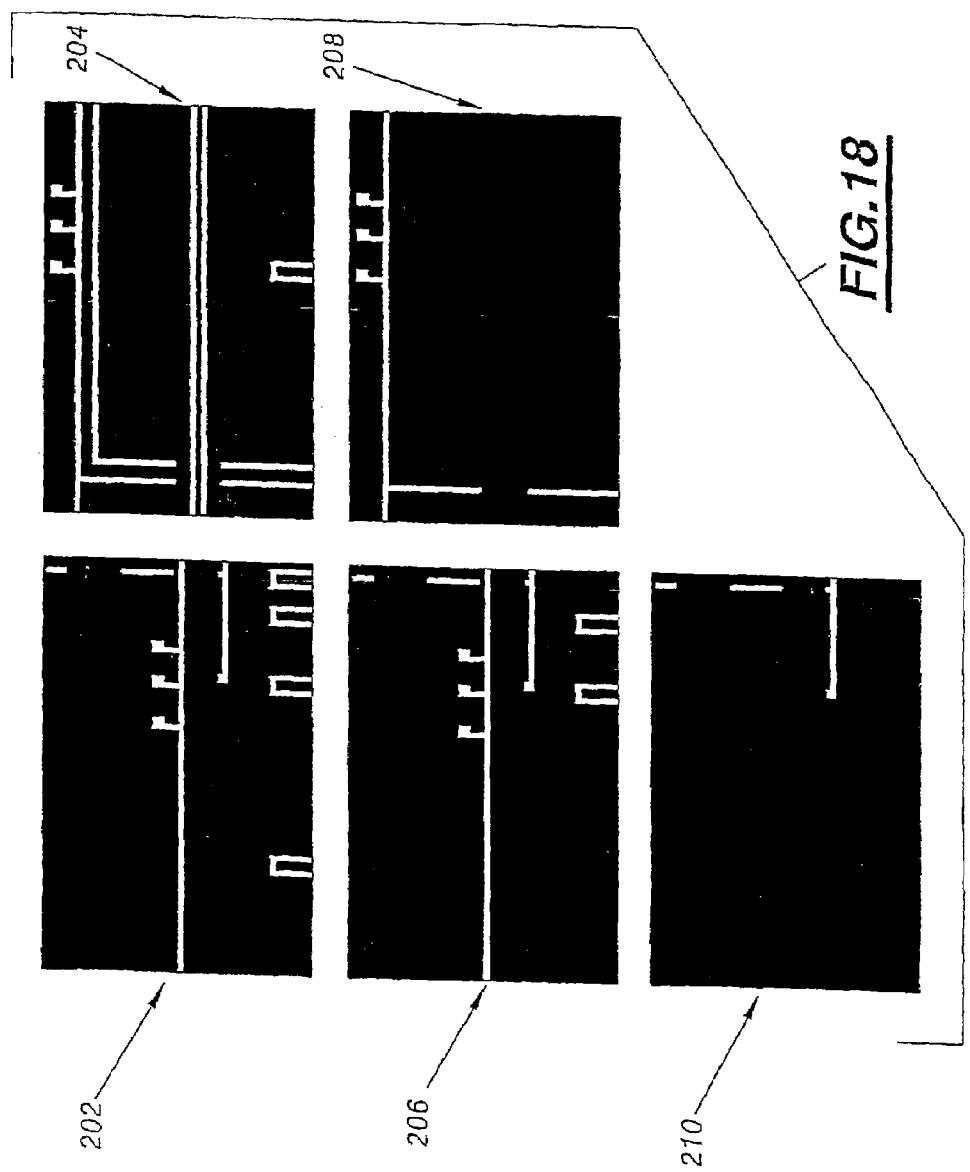

METHOD FOR CUSTOMIZING AN INTEGRATED CIRCUIT ELEMENT

FIELD OF THE INVENTION

The present invention relates to a method of picking out an individual integrated circuit element.

BACKGROUND OF THE INVENTION

In order to analyze an integrated circuit formed on a semiconductor substrate, it is necessary to perform optical analyses of the circuit in operation, for example by light-emission microscopy or using a scanning electron microscope.

Nevertheless, it is difficult on a real circuit to locate the exact point of the circuit where a measurement is to be performed. This task is made even more difficult in numerous cases, for example with programmable circuits, because the exact configuration of the real circuit is not known. Thus, the real coordinates of the tracks of the circuit are not available. In addition, the tracks of the circuit are often smaller in size than the positioning error of the tool used for observing the circuit.

In contrast, the circuit diagram of the circuit is generally available, even if the real layout of the circuit on the semiconductor substrate is not available.

OBJECT OF THE INVENTION

An object of the invention is to propose a method of picking out an integrated circuit element whose real layout is not necessarily known, which method makes it possible on the basis of the theoretical layout of the circuit, to take a measurement directly on the real circuit at the location of the circuit element picked out in this way, for example.

SUMMARY OF THE INVENTION

To this end, the invention provides a method of picking out an integrated circuit element, the method being characterized in that it comprises the steps consisting in:

a) from a model of the circuit, determining a set of vectors each corresponding to an instant in the theoretical operation of the circuit while a predetermined test sequence is being applied, the coefficients of each vector being representative of the state of a given set of circuit elements including the element that is to be picked out;

b) comparing vectors to define a composite of logic operators applied to said vectors, the composite enabling the coefficient corresponding to said element that is to be picked out or to be extracted;

c) taking images of the circuit in operation at instants corresponding to the vectors to which said composite of logic operators is applied; and d) graphically combining the taken images by applying a composite of graphics operators corresponding to said composite of logic operators.

In particular implementations, the method further comprises one or more of the following characteristics:

step b) of defining a composite of logic operators comprises a recursive step of comparing a vector of the matrix and a result vector obtained from a prior comparison;

step b) of defining a composite of logic operators comprises generating a tree whose nodes are constituted by the results of the comparisons performed;

said set of vectors is a set of binary vectors, the coefficients being representative of the logic states of the associated circuit element;

said set of vectors is a set of ternary vectors, in which the coefficients are representative of changes of logic state in the associated circuit element; and prior to step b) of defining a composite of logic operators, the method comprises a step of classifying the vectors so as to increase their diversity.

The invention also provides apparatus for picking out an integrated circuit element, the apparatus being characterized in that it comprises:

means for using a model of the circuit to determine a set of vectors each corresponding to an instant in the theoretical operation of the circuit while a predetermined test sequence is being applied, the coefficients of each vector being representative of the state of a given set of circuit elements including the element that is to be picked out;

means for comparing vectors to define a composite of logic operators applied to said vectors, the composite enabling the coefficient corresponding to said element that is to be picked out;

means for taking images of the circuit in operation at instants corresponding to the vectors to which said composite of logic operators is applied; and means for graphically combining the taken images by applying a composite of graphics operators corresponding to said composite of logic operators.

BRIEF DESCRIPTION OF THE DRAWINGS

The invention will be better understood with the help of the following description given purely by way of example and made with reference to the accompanying drawings, in which:

FIG. 18 is a set of processed images of a single portion of an integrated circuit.

DETAILED DESCRIPTION OF THE INVENTION

The method of the invention makes it possible to find the exact position of a circuit element on an existing integrated circuit, for example a track, even though the exact layout of the integrated circuit is not known.

In order to implement the algorithm, it is necessary to know the electrical circuit diagram of the integrated circuit, or at least the logic states of the various tracks of the circuit as a function of a sequence of predetermined tests input to the circuit.

A defective element is located on an image of the circuit or of a portion of the circuit. The image is processed to show up only the looked-for element, picking it out relative to the other elements which appear normally on the image of the circuit. With the looked-for element picked out in this way in an image of the circuit, it is possible using the coordinates of the element on the image to find the position of said element on the integrated circuit proper and thus to apply a measuring device exactly on the circuit element as identified in this way.

Figure 1:
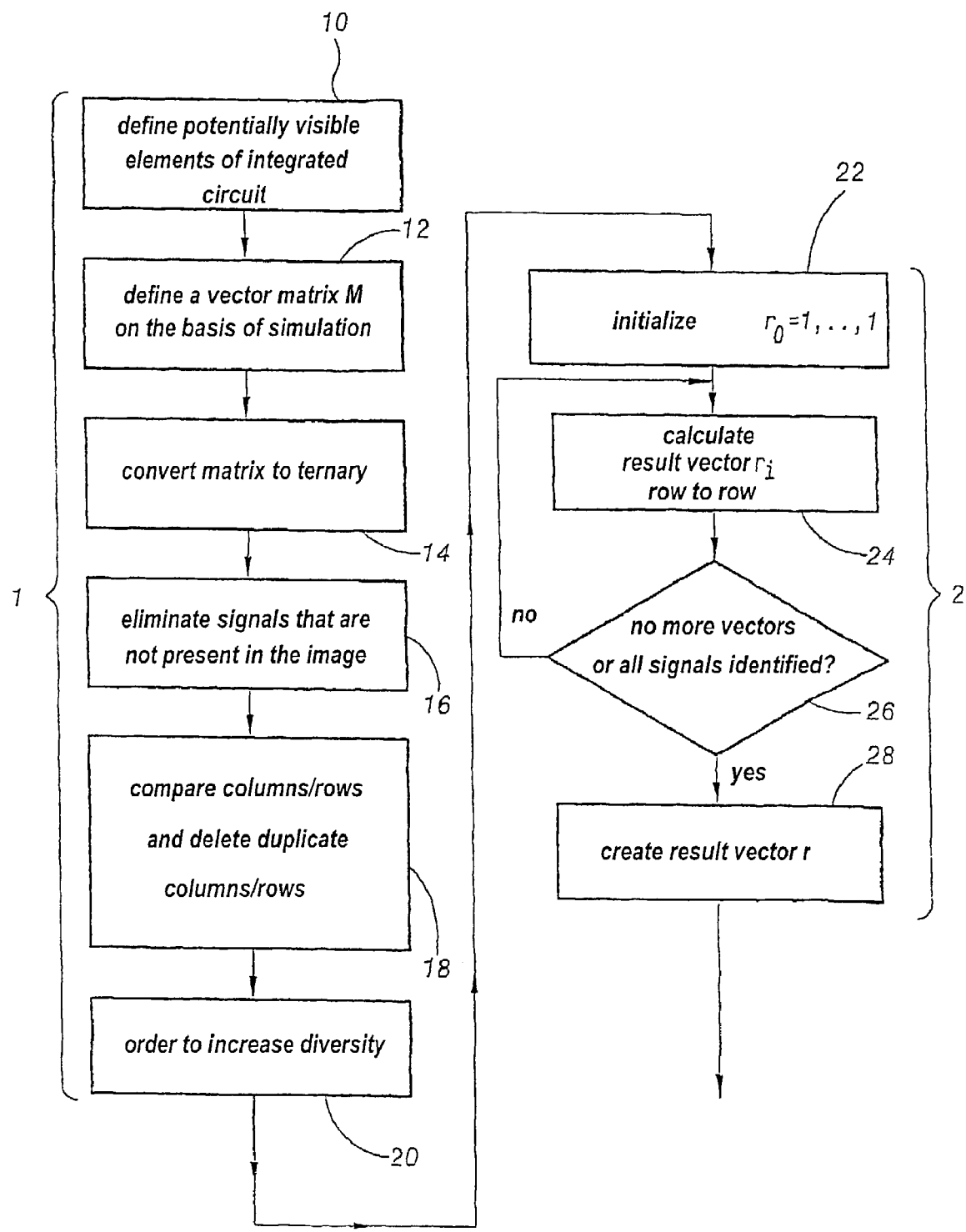
FIG. 1 is a flow chart of the method of the invention of picking out an integrated circuit element.

The method of the invention whose algorithm is shown in FIG. 1 comprises three successive stages.

The first stage 1 consists in using a theoretical circuit diagram of the integrated circuit to build a data structure representative of the theoretical operation of the circuit as a function of a sequence of predefined tests. Advantageously, this data structure is in the form of a matrix M whose coefficients are characteristic of the logic states of a set of determined circuit elements while applying the predefined test sequence.

This first stage integrates prior processing performed on the same matrix M. This processing serves to optimize implementation of the following stages.

The second stage 2 consists in obtaining a tree of structure that is representative of the processing that needs to be performed on a set of images of the circuit in operation in order to pick out a given element of the circuit in a processed image obtained by combining certain images of the circuit in operation.

The third stage 3 consists in taking images of the integrated circuit in operation at certain identified instants of the given test sequence and in combining these images in a sequence defined by the predetermined tree structure created as a function of the circuit element that is to be picked out.

The algorithm of FIG. 1 is described below in detail and is applied to an example illustrating each of its steps.

During an initial step 10 of stage 1, a set is defined of integrated circuit elements that are potentially visible on an image of the circuit in operation. In the highly simplified example considered below, it is assumed that these elements are ten in number and that they are formed by tracks formed in the semiconducting material. These tracks are referenced $a_1$ to $a_{10}$.

In practice, the entire area of the circuit is subdivided into adjacent zones, e.g. formed by adjacent square areas defined by a grid. The images obtained in this way of a portion only of the integrated circuit contain a small number of elements that are potentially visible. This number preferably lies in the range 50 to 100 elements per image.

Starting from the electrical circuit diagram of the circuit, a computer simulation of its operation is performed in step 12 in order to determine the logic states of the elements $a_1$ to $a_{10}$ while a predetermined test sequence is being input to the integrated circuit.

This test sequence consists in applying predetermined input values in a sequence that is likewise predetermined. At each instant in the operation of the circuit as simulated by the computer model, the logic states of the elements $a_1$ to $a_{10}$ are stored in vectors $b_1$ to $b_{10}$. Each vector corresponds to a predetermined test instant, and its coefficients are the logic states of the elements $a_1$ to $a_{10}$ at that instant.

In the example under consideration, only ten vectors $b_1$ to $b_{10}$ corresponding to ten successive test instants are considered. In practice, the number of test instants taken into consideration lies in the range 500 to 1000.

Once step 12 has been implemented, the computer simulation of the circuit provides a binary matrix M as defined below.

Matrix M:

|  | $a_1$ | $a_2$ | $a_3$ | $a_4$ | $a_5$ | $a_6$ | $a_7$ | $a_8$ | $a_9$ | $a_{10}$ |
|---|---|---|---|---|---|---|---|---|---|---|
| $b_1 =$ | 0 | 1 | 0 | 0 | 1 | 0 | 1 | 0 | 0 | 1 |
| $b_2 =$ | 0 | 1 | 0 | 1 | 0 | 1 | 0 | 1 | 0 | 1 |
| $b_3 =$ | 1 | 0 | 0 | 1 | 0 | 1 | 1 | 1 | 1 | 0 |
| $b_4 =$ | 1 | 0 | 1 | 0 | 1 | 0 | 0 | 0 | 1 | 1 |
| $b_5 =$ | 1 | 0 | 1 | 1 | 0 | 1 | 1 | 1 | 1 | 1 |
| $b_6 =$ | 0 | 0 | 0 | 0 | 0 | 0 | 0 | 0 | 0 | 0 |
| $b_7 =$ | 1 | 1 | 1 | 1 | 0 | 1 | 1 | 1 | 1 | 1 |
| $b_8 =$ | 0 | 1 | 0 | 0 | 0 | 0 | 0 | 0 | 0 | 1 |
| $b_9 =$ | 1 | 0 | 0 | 0 | 1 | 0 | 1 | 0 | 0 | 1 |
| $b_{10} =$ | 1 | 0 | 0 | 1 | 1 | 1 | 1 | 1 | 0 | 1 |

In this matrix, the vectors $b_1$ to $b_{10}$ constitute the rows. The coefficients making up each vector are coefficients that are representative of the logic states of the elements $a_1$ to $a_{10}$.

Once this matrix M has been defined, an optional step 14 of converting the binary matrix into a ternary matrix is implemented as a function of the type of analyzer device that is to be used for observing the integrated circuit in operation.

When the analyzer equipment is constituted by a light-emitting microscope, the binary matrix as initially formed is left unchanged and as a result step 14 is omitted. Otherwise, if the analyzer equipment is constituted by a scanning electron microscope, a ternary matrix is formed on the basis of the initially created binary matrix.

In the description below of the algorithm, it is assumed that a light-emitting microscope is used so that the binary matrix does not need to be converted into a ternary matrix. The implementation of step 14 is described separately after a full description of the algorithm.

In following steps 16 to 20 that complete stage 1, prior processing is performed on the matrix M in order to increase the speed with which the algorithm is implemented.

In particular, in step 16, the elements not present in an image of the region of the circuit under consideration are omitted. For this purpose, the columns corresponding to elements that are not potentially visible on the image under consideration are deleted. For example, during analysis with a scanning electron microscope, no consideration is given to non-visible elements corresponding to metal tracks that are buried. To determine whether an element is visible, correspondence is used between the names of the elements in the electrical circuit diagram and the numbers of the corresponding polygons in the layout, assuming they are available.

If no top metal polygon exists for a looked-for element having the corresponding layout number, then that column is excluded. In step 18, the rows and the columns of the matrix are compared with one another. Rows or columns that are identical are deleted in order to avoid duplicate processing later on.

In following step 20, the vectors corresponding to the various test instants are classified so as to increase their diversity. This classification for the purpose of increasing diversity consists in making permutations between the various rows of the matrix. Diversity is obtained by classifying the vectors from most significant to least significant and then reorganizing the vectors by alternating more significant vectors and less significant vectors.

In the example under consideration for illustrating the implementation of the algorithm, it is assumed that all of the elements under consideration are potentially present in the image so that implementing step 16 has no effect.

Steps 16 to 20 are optional. In this case, steps 18 and 20 have been omitted.

At the end of stage 1 in which the matrix M is defined, stage 2 is performed for creating the binary tree.

Figure 2:
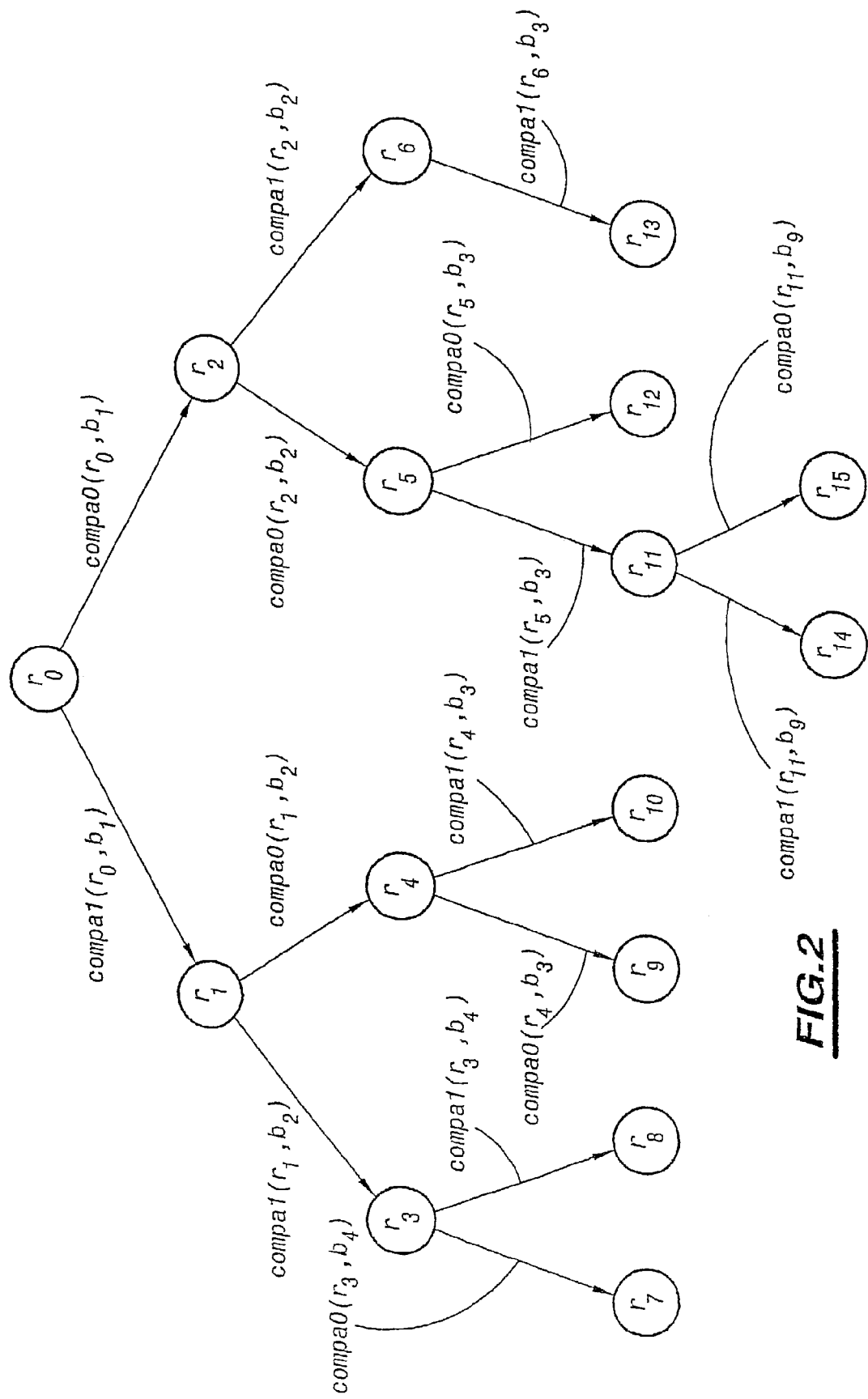
FIG. 2 is a binary tree representation obtained while implementing the algorithm shown in the flow chart of FIG. 1.

During this stage, a set of result vectors written $r_i$ is built up. These vectors form the nodes of a binary tree as shown in FIG. 2. Each is constituted by the result of comparing a vector $b_i$ of the matrix M with another result vector $r_j$ that has already been obtained. Vector comparison is performed coefficient by coefficient by implementing two logic operators, written compa0 and compa1. The truth tables of these two operators compa0 and compa1 are given below.

|  | X | Y | compa1 (X, Y) |
|---|---|---|---|
| compa1 | 0 | 0 | 0 |
|  | 0 | 1 | 0 |
|  | 1 | 0 | 0 |
|  | 1 | 1 | 1 |

|  | X | Y | compa0 (X, Y) |
|---|---|---|---|
| compa0 | 0 | 0 | 0 |
|  | 0 | 1 | 0 |
|  | 1 | 0 | 1 |
|  | 1 | 1 | 0 |

In each of these truth tables, the possible values for a first operand X are given in the first column, the possible values for a second operand Y are given in the second column, and the result of the logic operator applied to the two operands under consideration is given in the last column.

The result vectors created while implementing the algorithm are obtained by applying one or other of the logic operators compa0 and compa1 to one of the earlier result vectors $r_i$ and one of the vectors $b_i$ of the matrix M as previously built up. Thus, the result vectors $r_i$ have the same number of coefficients as the vectors $b_1$ to $b_{10}$ of the matrix.

Each result vector $r_i$ corresponds to a processed image of the region under consideration of the circuit. This processed image is obtained by combining real images as taken of the region under consideration of the circuit at distinct instants of operation while applying the test sequence. These images are combined in a sequence corresponding to the sequence for obtaining the associated result vector, and as described by the structure of the tree.

The result vectors are created by implementing a recursive algorithm during which each result vector is compared with a vector of the matrix by implementing both of the logic operators compa0 and compa1, and this is continued so long as the result obtained in this way differs from the prior result vector to which the logic operator is applied and so long as there remain vectors in the matrix M that have not been taken into consideration.

As they are created, the result vectors $r_i$ are placed in a binary tree in which each newly calculated result vector has as its ancestor the vector that was as an operand for calculating it.

Starting from the matrix M that is being considered by way of example, the resulting tree is as shown in FIG. 2. To create this tree, the recursive procedure is initiated in step 22 (FIG. 1) where a first result vector referenced $r_0$ is taken in which all of its coefficients are equal to 1.

The other result vectors are calculated recursively in step 24 until all of the vectors of the matrix M have been taken into consideration or until each of the result vectors obtained can no longer be compared with a vector of the matrix and produce a result differs from the result vector under consideration in the comparison. An end test for calculating result vectors is thus performed in step 26.

With the matrix M under consideration by way of example, the algorithm is applied as follows.

The result vector $r_0$ is initially compared with the vector $b_1$ by applying both logic operators compa1 and compa0 in order to obtain respective result vectors $r_1$ and $r_2$.

The values of $r_1$ and $r_2$ are given in Table 1 below.

For reasons of clarity, throughout the description below, the non-zero coefficients of each result vector $r_i$ are set arbitrarily as the integer i used as the index for the result vector. In the tables, the logic operator that is applied is specified in the last column.

TABLE 1

|  | $a_1$ | $a_2$ | $a_3$ | $a_4$ | $a_5$ | $a_6$ | $a_7$ | $a_8$ | $a_9$ | $a_{10}$ |  |
|---|---|---|---|---|---|---|---|---|---|---|---|
| $r_0$ | 1 | 1 | 1 | 1 | 1 | 1 | 1 | 1 | 1 | 1 |  |
| $b_1$ | 0 | 1 | 0 | 0 | 1 | 0 | 1 | 0 | 0 | 1 |  |
| $r_1$ | 0 | 1 | 0 | 0 | 1 | 0 | 1 | 0 | 0 | 1 | compa1 ($r_0$, $b_1$) |
| $r_2$ | 2 | 0 | 2 | 2 | 0 | 2 | 0 | 2 | 2 | 0 | compa0 ($r_0$, $b_1$) |

Applying logic operators compa0 and compa1 to vectors $r_0$ and $b_1$ provides the two nodes of the tree that depend from the root $r_0$. Each branch of the tree is associated with one of the logic operators compa0 and compa1 as shown in FIG. 2.

To create the second level of the tree, the result vectors $r_1$ and $r_2$ are compared with the following vector of the matrix M, i.e. with the vector $b_2$ by applying the two logic operators compa0 and compa1. Thus, there are created nodes of the tree corresponding to result vectors $r_3$ and $r_4$, which nodes are attached to the node corresponding to result vector $r_1$, and similarly nodes corresponding to result vectors $r_5$ and $r_6$ which are attached to the node corresponding to result vector $r_2$.

The values of the result vectors $r_3$ to $r_6$ are given in Tables 2.1 and 2.2 below. In these tables, zero coefficients in the vectors $r_1$ and $r_2$ have been omitted for reasons of clarity since regardless of the values of the vector coefficients with which they are compared, the result of the logic operation is zero, given the definitions of the operators compa0 and compa1.

TABLE 2.1

|  | $a_1$ | $a_2$ | $a_3$ | $a_4$ | $a_5$ | $a_6$ | $a_7$ | $a_8$ | $a_9$ | $a_{10}$ |  |
|---|---|---|---|---|---|---|---|---|---|---|---|
| $R_1$ |  | 1 |  |  | 1 |  | 1 |  |  | 1 |  |
| $B_2$ |  | 1 |  |  | 0 |  | 0 |  |  | 1 |  |
| $R_3$ |  | 3 |  |  |  |  |  |  |  | 3 | compa1 ($r_1$, $b_2$) |
| $R_4$ |  |  |  |  | 4 |  | 4 |  |  |  | compa0 ($r_1$, $b_2$) |

TABLE 2.2

|     | $a_1$ | $a_2$ | $a_3$ | $a_4$ | $a_5$ | $a_6$ | $a_7$ | $a_8$ | $a_9$ | $a_{10}$ |                    |
|-----|-------|-------|-------|-------|-------|-------|-------|-------|-------|----------|--------------------|
| $R_2$ | 2   |       | 2     | 2     |       | 2     |       | 2     | 2     |          |                    |
| $B_2$ | 0   |       | 0     | 1     |       | 1     |       | 1     | 0     |          |                    |
| $R_5$ | 5   |       | 5     |       |       |       |       |       | 5     |          | compa0 ($r_2$, $b_2$) |
| $R_6$ |     |       |       | 6     |       | 6     |       | 6     |       |          | compa1 ($r_2$, $b_2$) |

To create the third level of the tree, the algorithm continues by comparing result vector $r_3$ with vector $b_3$ of the matrix. However, and as can be seen in Table 3.1 below, the coefficients of vectors $r_3$ and $b_3$ are analogous, such that the result of comparing them does not lead to a result vector being defined that is not colinear with a result vector already present in the tree that is being created.

TABLE 3.1

|     | $a_1$ | $a_2$ | $a_3$ | $a_4$ | $a_5$ | $a_6$ | $a_7$ | $a_8$ | $a_9$ | $a_{10}$ |                    |
|-----|-------|-------|-------|-------|-------|-------|-------|-------|-------|----------|--------------------|
| $r_3$ | 3   |       |       |       |       | 3     |       |       |       |          |                    |
| $b_3$ | 0   |       |       |       |       | 0     |       |       |       |          |                    |
| $b_4$ | 0   |       |       |       |       | 1     |       |       |       |          |                    |
| $r_7$ | 7   |       |       |       |       |       |       |       |       |          | compa0 ($r_3$, $b_4$) |
| $r_8$ |     |       |       |       |       | 8     |       |       |       |          | compa1 ($r_3$, $b_4$) |

Thus, comparison between the vectors $r_3$ and $b_3$ is omitted. The comparison between the result vector $r_3$ and the following vector $b_4$ of the matrix is then performed in order to create result vectors $r_7$ and $r_8$ which are obtained respectively by applying the logic operators compa0 and compa1.

As shown in FIG. 2, the nodes corresponding to the result vectors $r_7$ and $r_8$ are connected to the node corresponding to the result vector $r_3$ by two branches associated respectively with the logic operators compa0 and compa1.

Insofar as the result vectors $r_7$ and $r_8$ have only one non-zero coefficient each, these vectors do not need to be subjected to any subsequent comparison since the result of comparing these vectors with any of the vectors of the matrix by applying logic operator compa0 or logic operator compa1 will lead either to a zero vector, or else to a vector that is identical. These vectors correspond to the leaves of the tree which do not need to be compared with any of the vectors in the matrix M.

Starting from result vectors $r_4$ and $r_5$, and comparing these two result vectors with the vector $b_3$, by applying the logic vectors compa0 and compa1, result vector pairs $r_9$, $r_{10}$ and $r_{11}$, $r_{12}$ are obtained. The details of these calculations are given in Tables 3.2 and 3.3 below.

TABLE 3.2

|        | $a_1$ | $a_2$ | $a_3$ | $a_4$ | $a_5$ | $a_6$ | $a_7$ | $a_8$ | $a_9$ | $a_{10}$ |                    |
|--------|-------|-------|-------|-------|-------|-------|-------|-------|-------|----------|--------------------|
| $r_4$  |       |       |       |       | 4     |       | 4     |       |       |          |                    |
| $b_3$  | 1     | 0     | 0     | 1     | 0     | 1     | 1     | 1     | 1     | 0        |                    |
| $r_9$  |       |       |       |       | 9     |       |       |       |       |          | compa0 ($r_4$, $b_3$) |
| $r_{10}$ |     |       |       |       |       |       | 10    |       |       |          | compa1 ($r_4$, $b_3$) |

TABLE 3.3

|        | $a_1$ | $a_2$ | $a_3$ | $a_4$ | $a_5$ | $a_6$ | $a_7$ | $a_8$ | $a_9$ | $a_{10}$ |                    |
|--------|-------|-------|-------|-------|-------|-------|-------|-------|-------|----------|--------------------|
| $r_5$  | 5     |       | 5     |       |       |       |       |       | 5     |          |                    |
| $b_3$  | 1     | 0     | 0     | 1     | 0     | 1     | 1     | 1     | 1     | 0        |                    |
| $r_{11}$ | 11  |       |       |       |       |       |       |       | 11    |          | Compa1 ($r_5$, $b_3$) |
| $r_{12}$ |     |       | 12    |       |       |       |       |       |       |          | Compa0 ($r_5$, $b_3$) |

It can be seen in these Tables 3.2 and 3.3 that the result vectors $r_9$, $r_{10}$, and $r_{12}$ constitute leaves of the tree, whereas result vector $r_{11}$ can still be compared pertinently with vectors of the matrix M, since result vector $r_{11}$ still has two non-zero coefficients.

Finally, to finish off the third level of the tree, the result vector $r_6$ is compared with a remaining vector in the matrix M. However, as can be seen clearly in Table 3.4 below, regardless of the remaining vector in the matrix M with which the result vector $r_6$ is compared, the result of the comparison by logic operator compa1 is identical to result vector $r_6$. Thus the result vector that is obtained, written $r_{13}$ constitutes a leaf of the tree connected to the node which corresponds to result vector $r_6$.

This situation could have been avoided by implementing step 18 which, in the example under consideration, was omitted.

TABLE 3.4

|          | $a_1$ | $a_2$ | $a_3$ | $a_4$ | $a_5$ | $a_6$ | $a_7$ | $a_8$ | $a_9$ | $a_{10}$ |                    |
|----------|-------|-------|-------|-------|-------|-------|-------|-------|-------|----------|--------------------|
| $r_6$    |       |       |       | 6     |       | 6     |       | 6     |       |          |                    |
| $b_3$    |       |       |       | 1     |       | 1     |       | 1     |       |          |                    |
| $b_4$    |       |       |       | 0     |       | 0     |       | 0     |       |          |                    |
| $b_5$    |       |       |       | 1     |       | 1     |       | 1     |       |          |                    |
| $b_6$    |       |       |       | 0     |       | 0     |       | 0     |       |          |                    |
| $b_7$    |       |       |       | 1     |       | 1     |       | 1     |       |          |                    |
| $b_8$    |       |       |       | 0     |       | 0     |       | 0     |       |          |                    |
| $b_9$    |       |       |       | 0     |       | 0     |       | 0     |       |          |                    |
| $b_{10}$ |       |       |       | 0     |       | 0     |       | 0     |       |          |                    |
| $r_{13}$ |       |       |       | 13    |       | 13    |       | 13    |       |          | Compa1 ($r_6$, $b_3$) |

Since result vectors $r_7$, $r_8$, $r_9$, $r_{10}$, $r_{12}$, and $r_{13}$ constitute leaves of the tree, only result vector $r_{11}$ is compared with a remaining vector of the tree in order to create vectors $r_{14}$ and $r_{15}$ which correspond respectively to applying logic operators compa1 and compa0.

The values of the vectors $r_{14}$ and $r_{15}$ are given in Table 4.1 below.

TABLE 4.1

|          | $a_1$ | $a_2$ | $a_3$ | $a_4$ | $a_5$ | $a_6$ | $a_7$ | $A_8$ | $a_9$ | $a_{10}$ |                    |
|----------|-------|-------|-------|-------|-------|-------|-------|-------|-------|----------|--------------------|
| $r_{11}$ | 11    |       |       |       |       |       |       |       | 11    |          |                    |
| $b_5$    | 1     |       |       |       |       |       |       |       | 1     |          |                    |
| $b_6$    | 0     |       |       |       |       |       |       |       | 0     |          |                    |
| $b_7$    | 1     |       |       |       |       |       |       |       | 1     |          |                    |
| $b_8$    | 0     |       |       |       |       |       |       |       | 0     |          |                    |
| $b_9$    | 1     |       |       |       |       |       |       |       | 0     |          |                    |
| $r_{14}$ | 14    |       |       |       |       |       |       |       |       |          | Compa1 ($r_{11}$, $b_9$) |
| $r_{15}$ |       |       |       |       |       |       |       |       | 15    |          | Compa0 ($r_{11}$, $b_9$) |

It can be seen that comparing result vector $r_{11}$ with vectors $b_5$ to $b_8$ of the matrix is pointless since these vectors are colinear. Only the comparison of vector $r_{11}$ with vector $b_9$ gives rise to vectors $r_{14}$ and $r_{15}$ which have coefficients that differ from the coefficients of vector $r_{11}$.

Since vectors $r_{14}$ and $r_{15}$ have only one non-zero coefficient each, they constitute leaves of the tree, and as a result comparisons between the vectors of the matrix M and the result vectors $r_i$ that are created thereby are terminated.

Once vectors $r_1$ to $r_{13}$ have been calculated, a result vector $r$ is created in step 28. The coefficients of this vector are the non-zero coefficients of the set of result vectors that constitute leaves of the tree. By construction, these result vectors $r_i$ all have non-zero coefficients in distinct positions.

The result vector $r$ appears as the bottom row of Table 5 below in which the result vectors $r_7$, $r_8$, $r_9$, $r_{10}$, $r_{12}$, $r_{13}$, $r_{14}$, and $r_{15}$ constituting the leaves of the tree are reproduced.

TABLE 5

| | $a_1$ | $a_2$ | $a_3$ | $a_4$ | $a_5$ | $a_6$ | $a_7$ | $a_8$ | $a_9$ | $a_{10}$ |
|---|---|---|---|---|---|---|---|---|---|---|
| $r_7$ | | 7 | | | | | | | | |
| $r_8$ | | | | | | | | | | 8 |
| $r_9$ | | | | | 9 | | | | | |
| $r_{10}$ | | | | | | | 10 | | | |
| $r_{12}$ | | | 12 | | | | | | | |
| $r_{13}$ | | | | 13 | | 13 | | 13 | | |
| $r_{14}$ | 14 | | | | | | | | | |
| $r_{15}$ | | | | | | | | | 15 | |
| $r$ | 14 | 7 | 12 | 13 | 9 | 13 | 10 | 13 | 15 | 8 |

From the result vector $r$ and the tree shown in FIG. 2, a combination of images is deduced for each element of the integrated circuit in order to ensure that it is picked out individually in a processed image. These steps form stage 3 of the algorithm.

Image combination is performed on images of the integrated circuit taken at defined instants in the test sequence applied to the circuit.

More precisely, image combinations are performed by applying two graphics operators splitby1 and splitby0 acting on images in order to compare them pixel to pixel.

The operator splitby1 applied to two images of the circuit leads to creating a result image formed by applying the AND function to the corresponding pixels of the two images. This operator consists physically in covering the black zones of an image with the corresponding white zones of the other image.

The operator splitby0 applied to two images of the circuit leads to a result image being created that is formed by applying the OR function to corresponding pixels in the two images. This operator consists physically in covering the white zones of one image with the corresponding black zones of the other image.

In order to determine which image comparisons should be performed in order to pick out a given element $a_i$, the value of the coefficient $i$ in the vector $r$ is determined and the tree shown in FIG. 2 is used to provide the combination of logic operators that have led to obtaining result vector $r_i$.

For each of the logic operations performed starting at the root of the tree and going to the leaf corresponding to result vector $r_i$, a corresponding graphics operator splitby0 and splitby1 is defined. This produces a combination of graphics operators to be applied in a sequence that is the reverse of the sequence in which the logic operators compa0 and compa1 were applied from the root of the tree to the leaf under consideration.

Graphics operator splitby1 is used on the images as a replacement for logic operator compa1 as applied to the vectors, and graphics operator splitby0 is used on the images as a replacement for the logic operator compa0 applied to the vectors.

Whereas the logic operators compa0 and compa1 are applied to the vectors $b_i$ of the matrix M and to the result vectors $r_i$, the graphics operators splitby0 and splitby1 are applied to images of the circuit in operation taken at identified instants of the test sequence and to images that have already been processed by applying these graphics operators.

Figure 3:
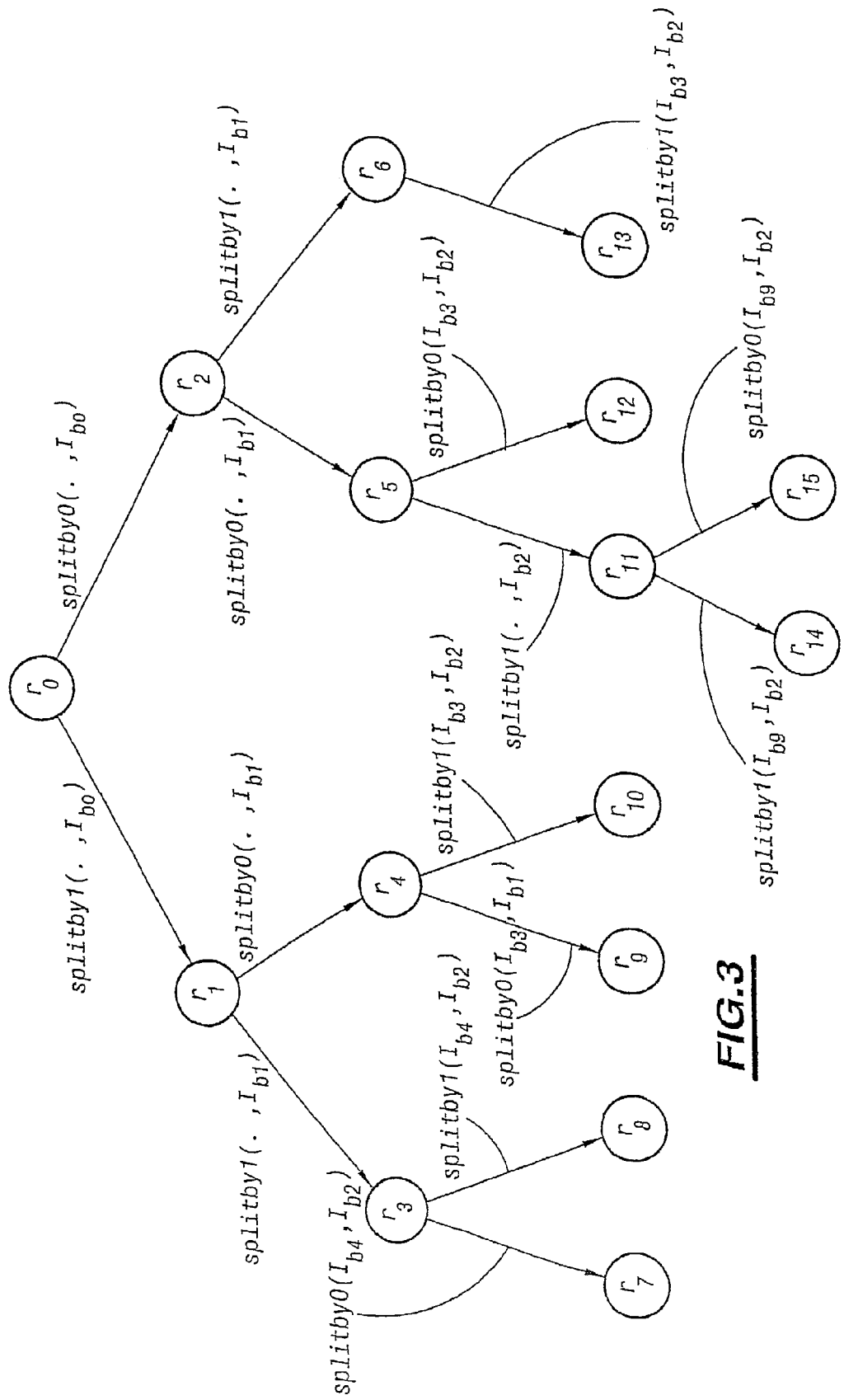
FIG. 3 is a binary tree representation showing the image combinations to be implemented in order to individualize various elements of an integrated circuit.

In order to illustrate this transposition of operators applied to the vectors onto operators applied to the images, FIG. 3 shows a binary tree corresponding to the tree of FIG. 2 in which the logic operators compa0 and compa1 are replaced by graphics operators splitby0 and splitby1. These graphics operators are applied to the images of the circuit taken at the instants corresponding to vectors $b_i$ of the matrix M. Thus, in FIG. 3, the image taken at the instant corresponding to vector $b_i$ is written $I_{bi}$.

In this figure, the operand marked by a point corresponds to the processed image obtained by applying one or the other of the operators under consideration at the lower level of the tree.

The operators splitby1 and splitby0 are combined in the order of the path defined by the tree going from the leaf $r_i$ under consideration to the root $r_0$.

Thus, by way of example, in order to isolate elements $a_2$, the reverse sequence to that which enables result vector $r_7$ to be obtained is applied to the images. This is because the second coefficient of the vector $r$, i.e. the coefficient corresponding to element $a_2$, is equal to 7.

More precisely, and as can be seen in FIG. 3, in order to individualize element $a_2$, the following logic sequence is defined:

apply graphics operator splitby0 to images $I_{b4}$ and $I_{b2}$;

apply graphics operator splitby1 to the previously obtained image and image $I_{b1}$; and then apply graphics operator splitby1 to the previously obtained image and image $I_{b0}$.

The image $I_{b0}$ is a completely black image corresponding to a logic state equal to 1 for all of the nodes of the circuit.

At the end of step 30 for building up the sequence of graphics operators, the images needed for applying the above-defined operators in order to individualize a predefined element in an image are acquired in step 32. During this step, the images of the portion concerned of the circuit are those stored while applying the predefined sequence of tests, and specifically at the instants corresponding to the vectors $b_i$ used in calculating the result vector that corresponds to the circuit element that is to be picked out.

During step 34, the images are processed by being digitized so as to reduce their color depth to two colors, namely black and white.

In subsequent step 36, the combination of splitby1 and splitby0 operators is applied to the images acquired in step 32 and processed in step 34.

In step 38, the image obtained by applying the operators is displayed. The element that is to be picked out appears on its own in this image. The coordinates of the element as picked out in this way are extracted in step 40.

It will be understood that the image combinations performed consist in masking certain portions of an image by a corresponding portion of another image of different color, and enables undesired circuit elements to be extracted from the final processed image while maintaining on the processed image only the element which is to be picked out.

The equipment for observing the circuit in operation, i.e. in the present case a light-emission microscope, can then be moved to the coordinates taken from the image in order to study accurately the operation of the circuit in the vicinity of said element.

In a variant, and in particular when using a scanning electron microscope for observing the integrated circuit in operation, optional step 14 of converting the binary matrix of logic states of the circuit into a ternary matrix is performed. The coefficients of this ternary matrix can take on three distinct values corresponding to three states of the circuit as observed by the scanning electron microscope.

For this purpose, conversion of the binary matrix into a ternary matrix relies on the ternary matrix having coefficients that are defined as follows:

N (black) when the logic state of the element under consideration goes from 0 to 1;

B (white) when the logic state of the element under consideration goes from 1 to 0; and G (gray) when the state of the element under consideration remains unchanged between two successive instants.

The table below gives an example of a matrix of binary states obtained for a test sequence of 24 vectors. The 22 circuit elements are labeled with letters A to W.

| element | A | B | C | D | E | F | G | H | I | J | L | M | N | O | P | Q | R | S | T | U | V | W |
|---|---|---|---|---|---|---|---|---|---|---|---|---|---|---|---|---|---|---|---|---|---|---|
| vector 0 | 0 | 1 | 0 | 1 | 0 | 0 | 0 | 1 | 1 | 1 | 1 | 0 | 1 | 0 | 0 | 0 | 0 | 0 | 1 | 0 | 0 | 0 |
| vector 1 | 1 | 0 | 0 | 0 | 0 | 0 | 1 | 0 | 0 | 1 | 1 | 0 | 1 | 1 | 0 | 0 | 0 | 0 | 1 | 0 | 1 | 1 |
| vector 2 | 0 | 1 | 1 | 0 | 0 | 1 | 0 | 0 | 0 | 0 | 1 | 1 | 0 | 1 | 1 | 0 | 0 | 0 | 0 | 0 | 0 | 1 |
| vector 3 | 0 | 0 | 1 | 0 | 1 | 0 | 1 | 0 | 1 | 1 | 1 | 1 | 1 | 1 | 1 | 1 | 1 | 0 | 1 | 0 | 1 | 1 |
| vector 4 | 0 | 1 | 1 | 1 | 0 | 0 | 1 | 1 | 0 | 0 | 1 | 1 | 1 | 1 | 1 | 1 | 0 | 1 | 0 | 0 | 1 | 1 |
| vector 5 | 1 | 1 | 1 | 0 | 0 | 1 | 1 | 0 | 1 | 0 | 1 | 0 | 0 | 1 | 1 | 1 | 0 | 1 | 0 | 0 | 1 | 1 |
| vector 6 | 1 | 0 | 0 | 1 | 1 | 1 | 0 | 1 | 0 | 0 | 1 | 0 | 0 | 0 | 0 | 1 | 0 | 0 | 1 | 1 | 1 | 0 |
| vector 7 | 0 | 0 | 0 | 0 | 0 | 1 | 0 | 1 | 0 | 0 | 0 | 1 | 0 | 0 | 0 | 1 | 0 | 1 | 0 | 0 | 0 | 1 |
| vector 8 | 0 | 0 | 1 | 0 | 0 | 0 | 1 | 1 | 0 | 1 | 1 | 0 | 1 | 0 | 1 | 0 | 1 | 1 | 0 | 1 | 0 | 1 |
| vector 9 | 0 | 1 | 1 | 0 | 0 | 1 | 1 | 0 | 0 | 0 | 0 | 0 | 1 | 1 | 1 | 1 | 0 | 0 | 0 | 0 | 0 | 1 |
| vector 10 | 1 | 0 | 0 | 0 | 1 | 0 | 0 | 0 | 0 | 1 | 0 | 1 | 0 | 1 | 0 | 1 | 1 | 0 | 0 | 1 | 1 | 0 |
| vector 11 | 1 | 0 | 1 | 1 | 0 | 0 | 0 | 1 | 0 | 0 | 1 | 1 | 0 | 0 | 1 | 1 | 1 | 0 | 1 | 0 | 0 | 1 |
| vector 12 | 0 | 0 | 1 | 1 | 1 | 1 | 1 | 1 | 1 | 1 | 1 | 1 | 0 | 1 | 0 | 0 | 1 | 1 | 0 | 1 | 1 | 0 |
| vector 13 | 1 | 1 | 0 | 0 | 1 | 0 | 0 | 1 | 0 | 0 | 0 | 0 | 1 | 1 | 1 | 1 | 1 | 0 | 1 | 1 | 0 | 1 |
| vector 14 | 0 | 0 | 1 | 0 | 0 | 0 | 1 | 1 | 0 | 0 | 1 | 0 | 1 | 1 | 0 | 0 | 1 | 1 | 0 | 1 | 1 | 0 |
| vector 15 | 0 | 0 | 1 | 1 | 0 | 1 | 0 | 1 | 1 | 0 | 0 | 1 | 0 | 0 | 0 | 0 | 1 | 0 | 0 | 1 | 0 | 1 |
| vector 16 | 1 | 1 | 0 | 0 | 1 | 1 | 1 | 1 | 1 | 0 | 1 | 1 | 0 | 0 | 0 | 1 | 0 | 0 | 0 | 1 | 1 | 0 |
| vector 17 | 0 | 1 | 1 | 0 | 0 | 0 | 0 | 1 | 1 | 0 | 1 | 1 | 1 | 0 | 0 | 1 | 0 | 0 | 0 | 0 | 0 | 0 |
| vector 18 | 1 | 0 | 0 | 1 | 1 | 0 | 0 | 0 | 0 | 1 | 0 | 1 | 0 | 1 | 0 | 1 | 0 | 1 | 0 | 0 | 0 | 0 |
| vector 19 | 1 | 0 | 0 | 1 | 0 | 0 | 0 | 0 | 0 | 1 | 1 | 0 | 1 | 0 | 0 | 0 | 0 | 1 | 0 | 1 | 1 | 1 |
| vector 20 | 1 | 0 | 1 | 0 | 1 | 0 | 1 | 1 | 0 | 1 | 0 | 1 | 1 | 1 | 0 | 0 | 1 | 1 | 1 | 0 | 0 | 1 |
| vector 21 | 1 | 1 | 1 | 1 | 1 | 0 | 1 | 0 | 0 | 0 | 1 | 0 | 1 | 0 | 0 | 1 | 1 | 0 | 0 | 1 | 1 | 0 |
| vector 22 | 0 | 1 | 1 | 0 | 0 | 0 | 0 | 1 | 1 | 1 | 1 | 1 | 1 | 0 | 1 | 1 | 1 | 1 | 0 | 0 | 0 | 0 |
| vector 23 | 1 | 1 | 1 | 1 | 1 | 0 | 1 | 1 | 1 | 0 | 1 | 1 | 1 | 0 | 1 | 1 | 1 | 0 | 0 | 0 | 0 | 0 |

Figure 4:
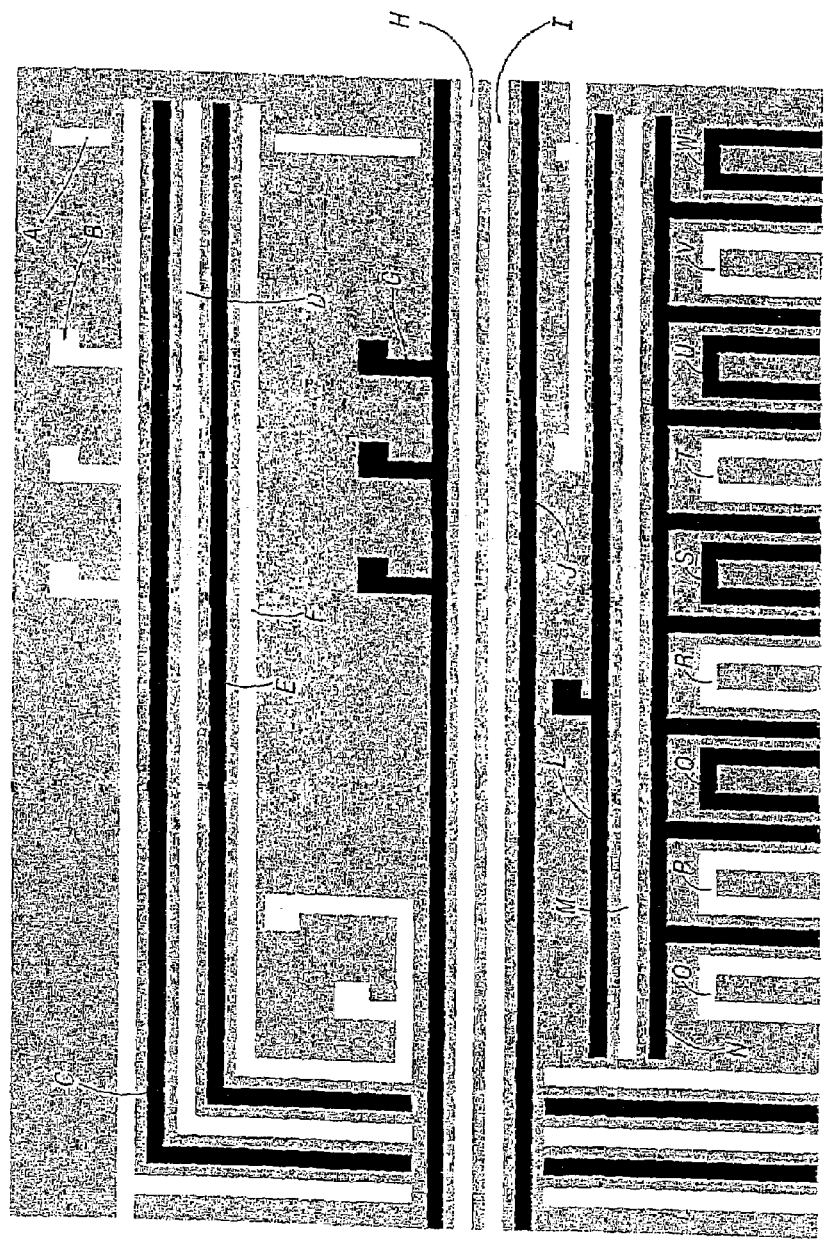
FIG. 4 is an elevation view of a portion of an integrated circuit.

FIG. 4 gives an image of the circuit in which there can be seen 22 tracks that are white in color or black in color. The tracks are identified by the letters A to W.

FIGS. 5 to 15 show the images of the circuit in operation as produced by a scanning electron microscope after digital processing for reducing the number of color shades to three, namely black, white, and gray.

The images of FIGS. 5 to 15 are respective images of the circuit as it appeared at the instants corresponding to the first 11 rows of the ternary matrix given below.

Using the rules defined above, converting the matrix of binary logic states into a ternary matrix produces the matrix given below.

| element | A | B | C | D | E | F | G | H | I | J | L | M | N | O | P | Q | R | S | T | U | V | W |
|---|---|---|---|---|---|---|---|---|---|---|---|---|---|---|---|---|---|---|---|---|---|---|
| vector 1 | N | B | G | B | G | G | N | B | B | G | G | G | G | N | G | G | G | B | N | G | N | N |
| vector 2 | B | N | N | G | G | N | B | G | G | B | G | N | B | G | N | G | G | B | G | N | B | G |
| vector 3 | G | B | G | G | N | B | N | G | N | N | G | N | G | G | N | N | G | N | G | N | G | N |
| vector 4 | G | N | G | N | B | G | G | N | B | B | G | G | G | G | G | B | N | B | G | G | G | G |
| vector 5 | N | G | G | B | G | N | G | B | N | G | B | B | G | G | G | G | G | G | G | G | G | G |
| vector 6 | G | B | B | N | N | G | B | N | B | G | G | G | B | B | G | G | B | N | N | G | B | B |
| vector 7 | B | G | G | B | B | G | G | G | G | G | B | N | G | G | G | G | N | B | B | B | N |
| vector 8 | G | G | N | G | G | B | N | G | G | N | N | B | N | G | N | B | N | G | G | N | G | G |
| vector 9 | G | N | G | G | G | N | G | B | G | B | B | G | B | N | G | N | G | B | G | B | G | G |
| vector 10 | N | B | B | G | N | B | B | G | G | N | G | N | G | B | G | G | G | G | N | N | N | B |
| vector 11 | G | G | N | N | B | G | G | N | G | B | N | G | G | B | N | G | G | N | B | B | N |
| vector 12 | B | G | G | G | N | N | N | G | N | N | G | G | G | N | B | B | G | N | B | N | N | B |
| vector 13 | N | N | B | B | G | B | B | G | B | B | B | G | N | G | N | N | G | B | N | G | B | N |
| vector 14 | B | B | N | G | B | G | N | G | G | G | N | B | G | G | B | G | B | N | G | N | B |
| vector 15 | G | G | G | N | G | N | B | G | N | G | B | N | B | B | G | G | G | B | G | G | B | N |
| vector 16 | N | N | B | B | N | G | N | G | G | N | G | G | G | G | N | B | G | G | G | N | B |
| vector 17 | B | G | N | G | B | B | B | G | G | G | G | G | N | G | G | G | G | G | G | B | B | G |
| vector 18 | N | B | B | N | N | G | G | B | B | G | B | G | G | G | G | N | G | N | G | N | G | G |
| vector 19 | G | G | G | G | B | G | G | G | G | G | N | B | N | G | B | G | B | N | B | N | N |
| vector 20 | G | G | N | B | N | G | N | N | G | N | B | G | N | G | N | G | N | G | N | B | G |
| vector 21 | G | N | G | N | G | G | G | B | G | B | N | B | G | B | B | N | N | B | B | G | N | B |
| vector 22 | B | G | G | B | B | G | B | N | N | N | G | N | G | N | G | G | N | N | B | B | G |
| vector 23 | N | G | G | N | N | G | N | G | G | G | B | G | G | G | G | G | G | B | G | G | G |

From this matrix, a ternary tree is created in which the nodes of the tree correspond to result vectors obtained by comparing a prior result vector with one of the vectors of the ternary matrix by applying one of three logic operators compaN, compaB, and compaG, with each of these operators being constructed on the model of the operators compa1 and compa0.

The truth tables of these three logic operators are given below:

| X | Y | compaN | compaB | compaG |
|---|---|---|---|---|
| N | N | N | | |
| N | B | | B | |
| N | G | | | G |
| B | N | N | | |
| B | B | | B | |
| B | G | | | G |
| G | N | N | | |
| G | B | | B | |
| G | G | | | G |

Figure 16:
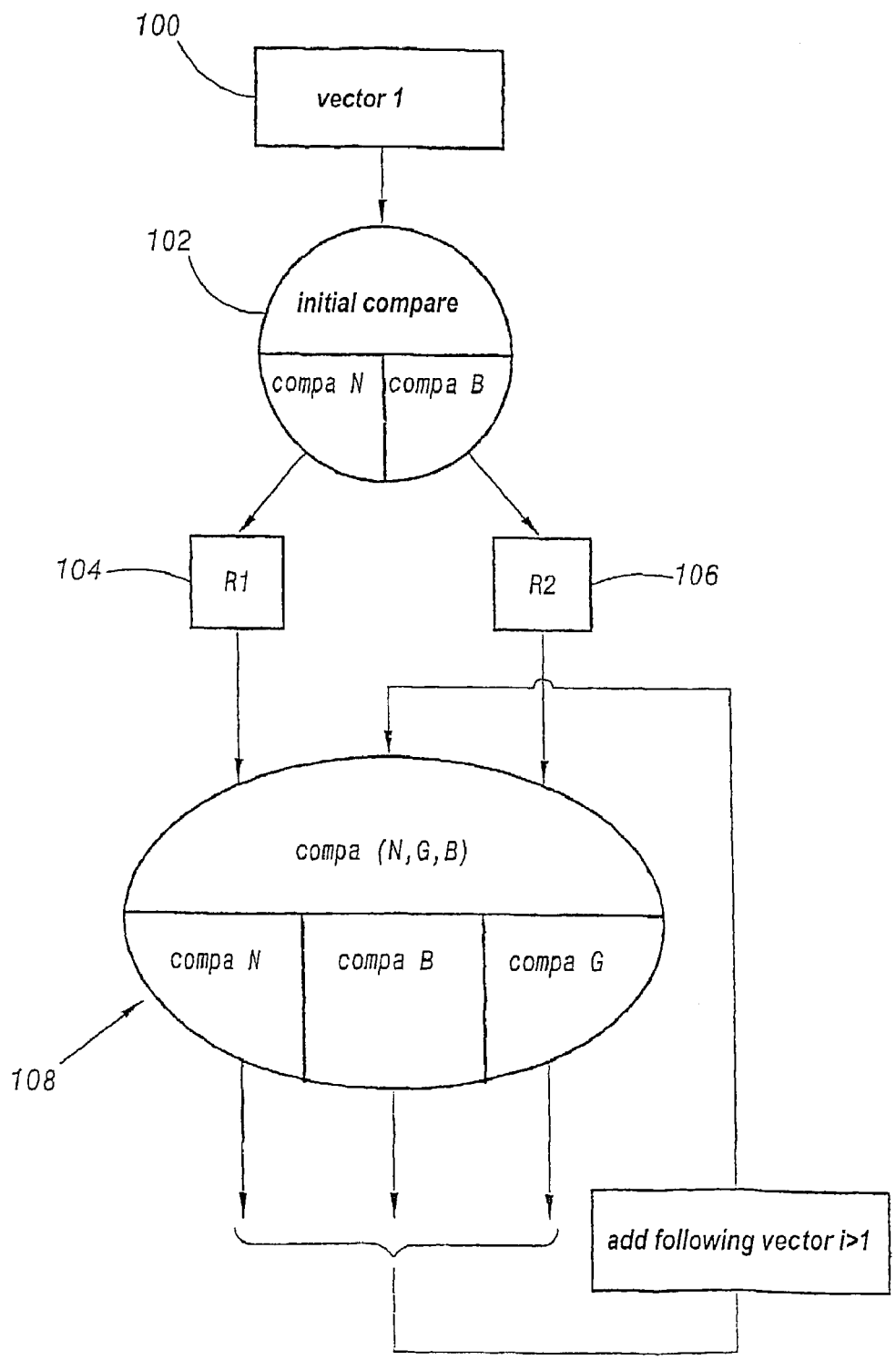
FIG. 16 is a flow chart of the initial steps of the method of picking out an integrated circuit element from a ternary matrix.

FIG. 16 is a simplified diagram showing the flow chart of the algorithm for creating the ternary tree by applying the logic operators compaN, compaB, and compaG.

Initially, in step 100, the vector 1 of the ternary matrix is considered. The vector 1 is compared in step 101 with a first result vector R0 having all of its coefficients equal to N by applying the logic operator compaN, and with a first result vector R0 in which all of the coefficients are set to be equal to B by applying the logic operator compaB. The vectors R1 and R2 created in this way are labeled 104 and 106.

A recursive procedure is then implemented at 108 to compare the previously created result vectors with the other vectors of the matrix, applying each of the operators compaN, compaB, and compaG. This procedure is represented by a loop in FIG. 16.

Using the ternary tree obtained in this way, a particular element of the circuit is picked out by combining images by applying a combination of graphics operators splitbyN, splitbyB, and splitbyG, these operators corresponding respectively to the logic operators compaN, compaB, and compaG.

The graphics operators splitbyN, splitbyB, and splitbyG act on images having three color levels (black, white, and gray) to combine two images pixel by pixel for the black, white, and gray elements respectively.

It will be understood that combining properly determined images using a pixel to pixel comparison of the images serves to cause substantially all of the undesired circuit elements to disappear from the final processed image, thereby picking out on said image the looked-for circuit element.

For example, the first stages of implementing the algorithm serving to individualize elements A and B are explained below.

Figure 17:
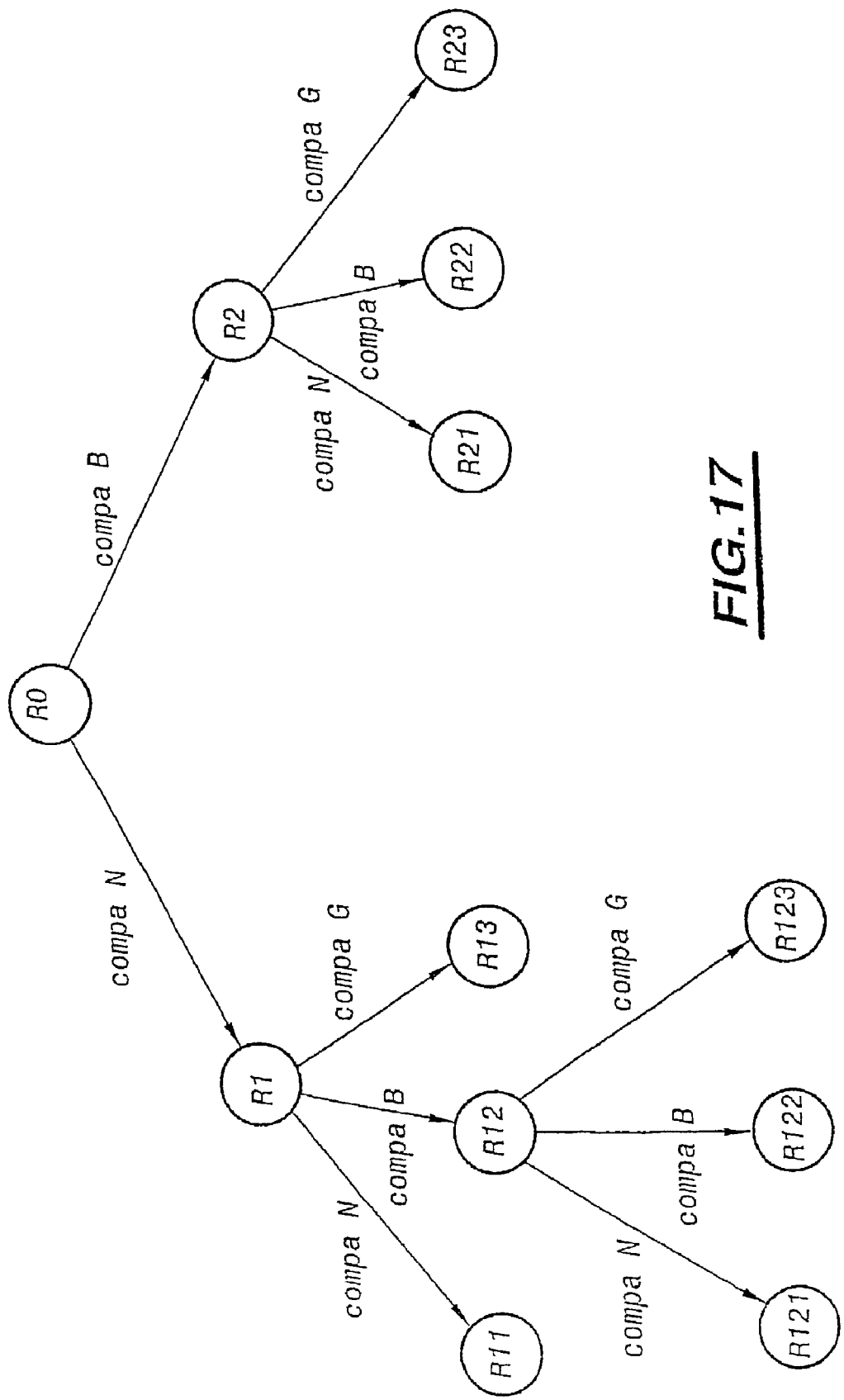
FIG. 17 is a representation of a tree obtained by implementing the method of the invention using a ternary matrix.

The tree created by implementing the algorithm is given in FIG. 17 and the images associated with the main nodes of the tree are given in FIG. 18.

By implementing the method, the vector 1 is initially compared with the vector R0 by applying logic operators compaN and compaB so as to give result vectors R1 and R2. The calculation of these vectors is given in Table 6 that appears at the end of the description.

Figure 5:
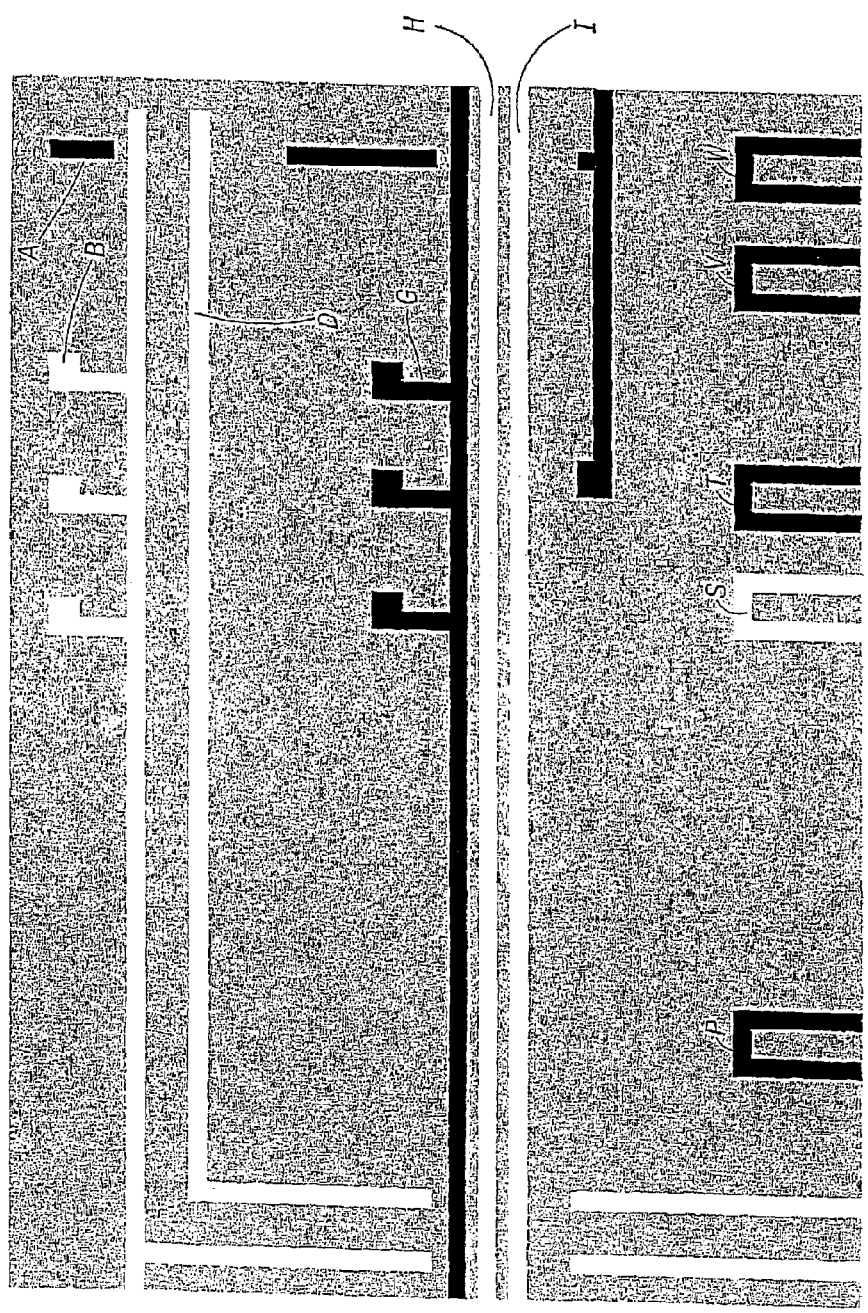
FIGS. 5 to 15 are views analogous to the view of FIG. 4 while applying distinct test vectors to the inputs of the circuit.

FIG. 18 shows the created images which correspond to result vectors R1 and R2 by applying the operators splitbyN and splitbyB respectively to the image of FIG. 5, and in FIG. 18 these images are designated by reference numbers 202 and 204.

Starting from result vector R1, new comparisons are performed to form higher level result vectors R11, R12, and R13, as explained in Table 7.1 which appears at the end of the description.

The image corresponding to result vector R11 is shown in FIG. 18 where it is referenced 206. This image is formed by applying graphics operator splitbyB to the image 202 and to the image of FIG. 6 which corresponds to vector 2.

In analogous manner, starting from result vector R2, higher level result vectors R21, R22, and R23 are formed as explained in Table 7.2 which appears at the end of the description.

The image corresponding to result vector R21 is shown in FIG. 18 where it is given reference 208.

Figure 6:
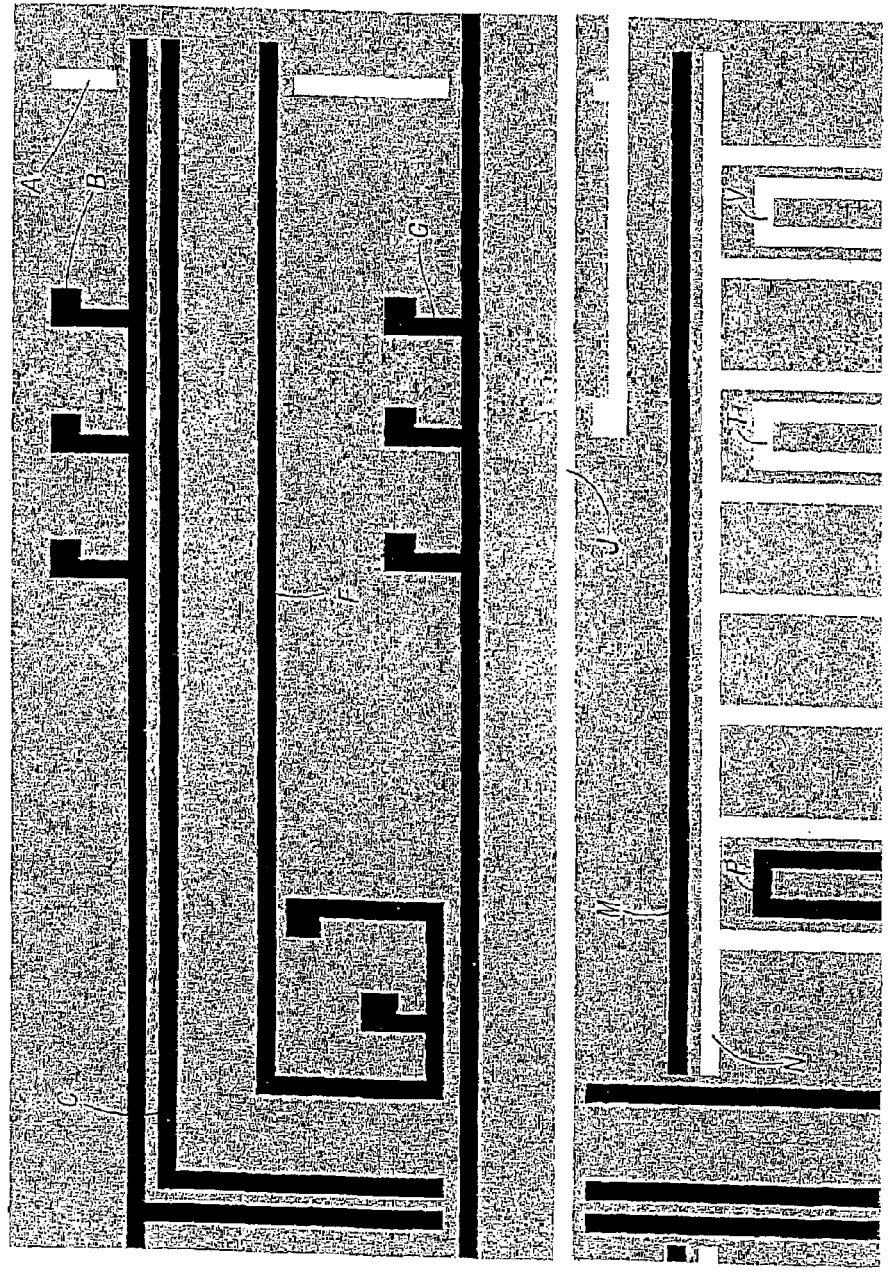

This image is formed by applying graphics operator splitbyN to image 204 and the image of FIG. 6 which corresponds to vector 2.

In image 208, the only element present is element B since as can be seen in Table 7.2, the only non-zero component of the result vector R21 is that which appears in the column corresponding to element B.

The result vector can be further divided, so new comparison steps are performed on the basis of this vector to form higher level result vectors R121, R122, and R123 as shown in Table 8.

The result vectors are made by comparing the vector 3 with the result vector R12 by applying the three logic operators.

The image corresponding to vector R123 is given in FIG. 18 where it is referenced 210.

Figure 7:
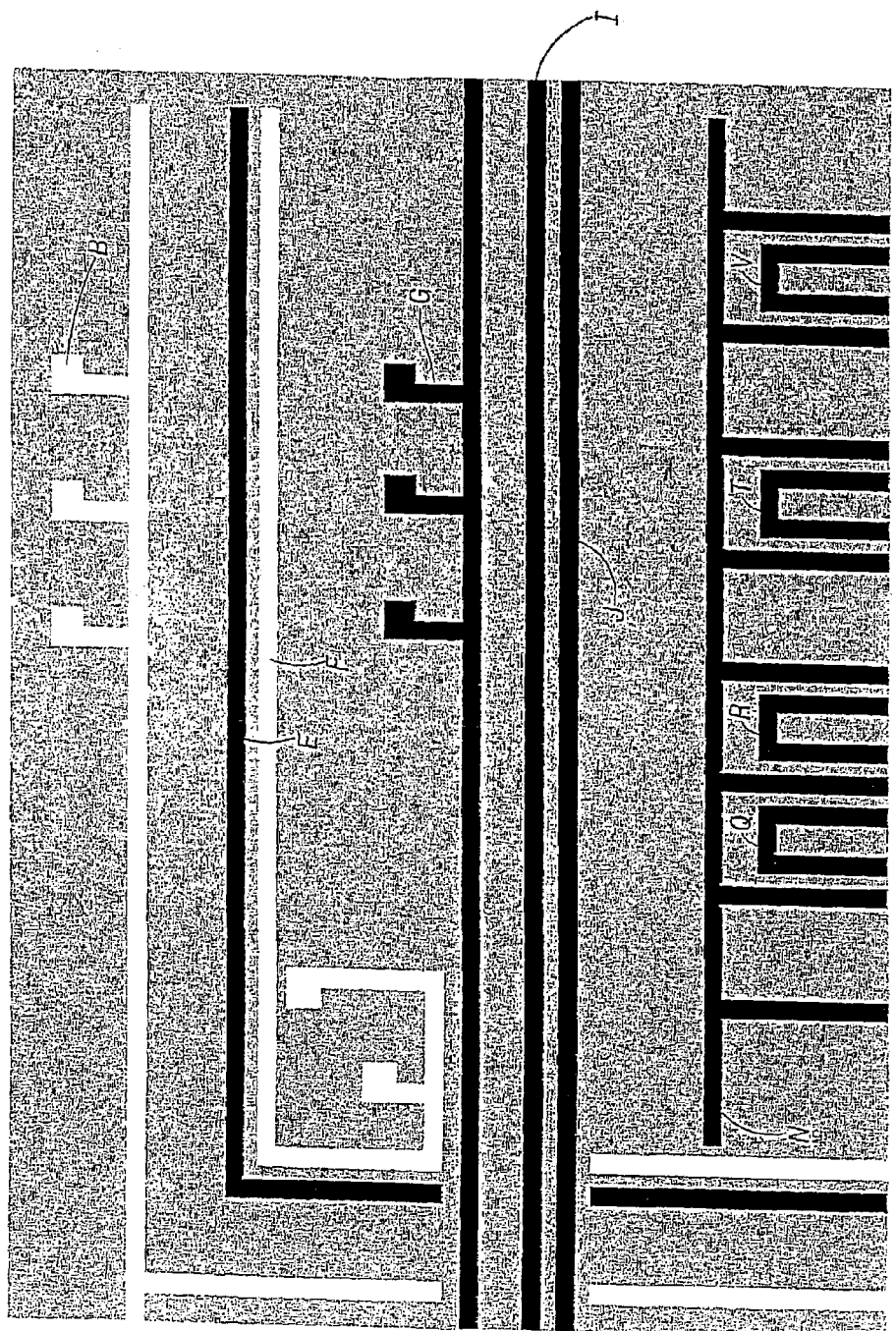
Figure 8:
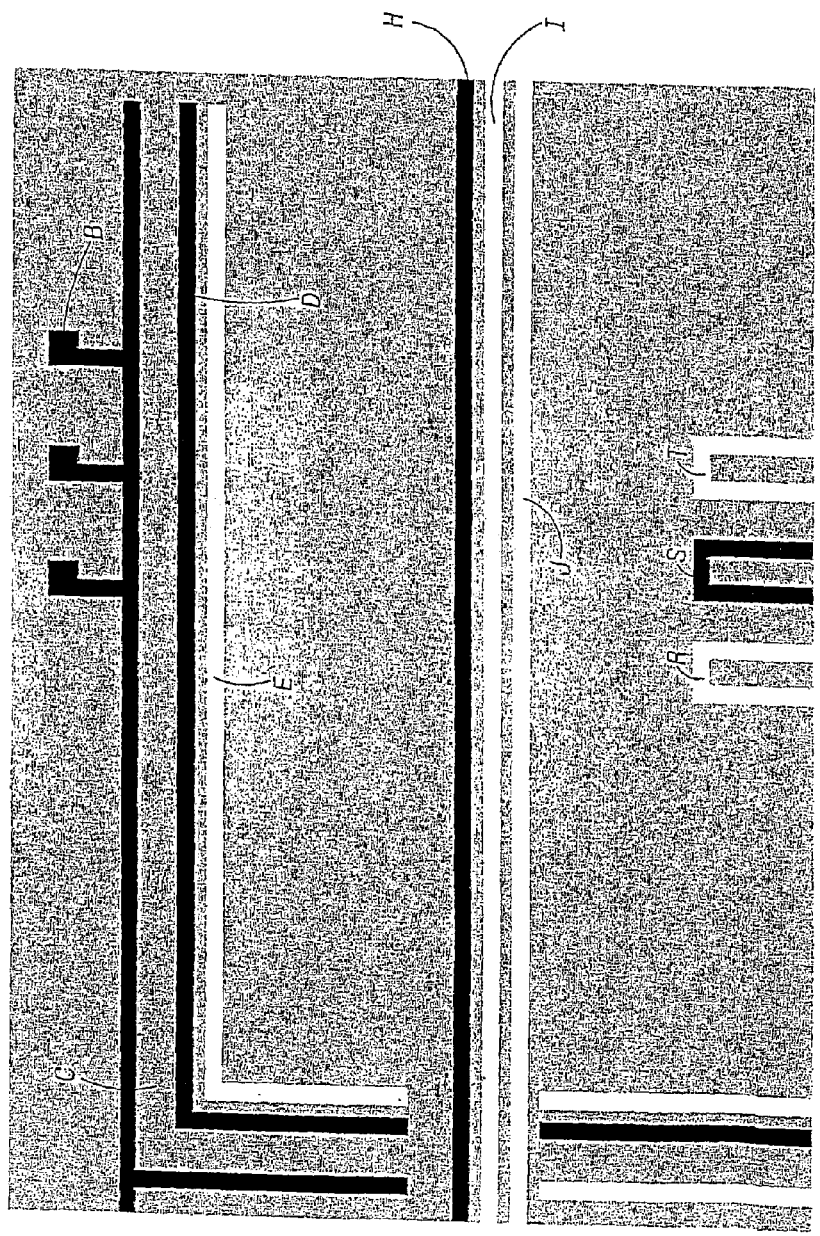
Figure 9:
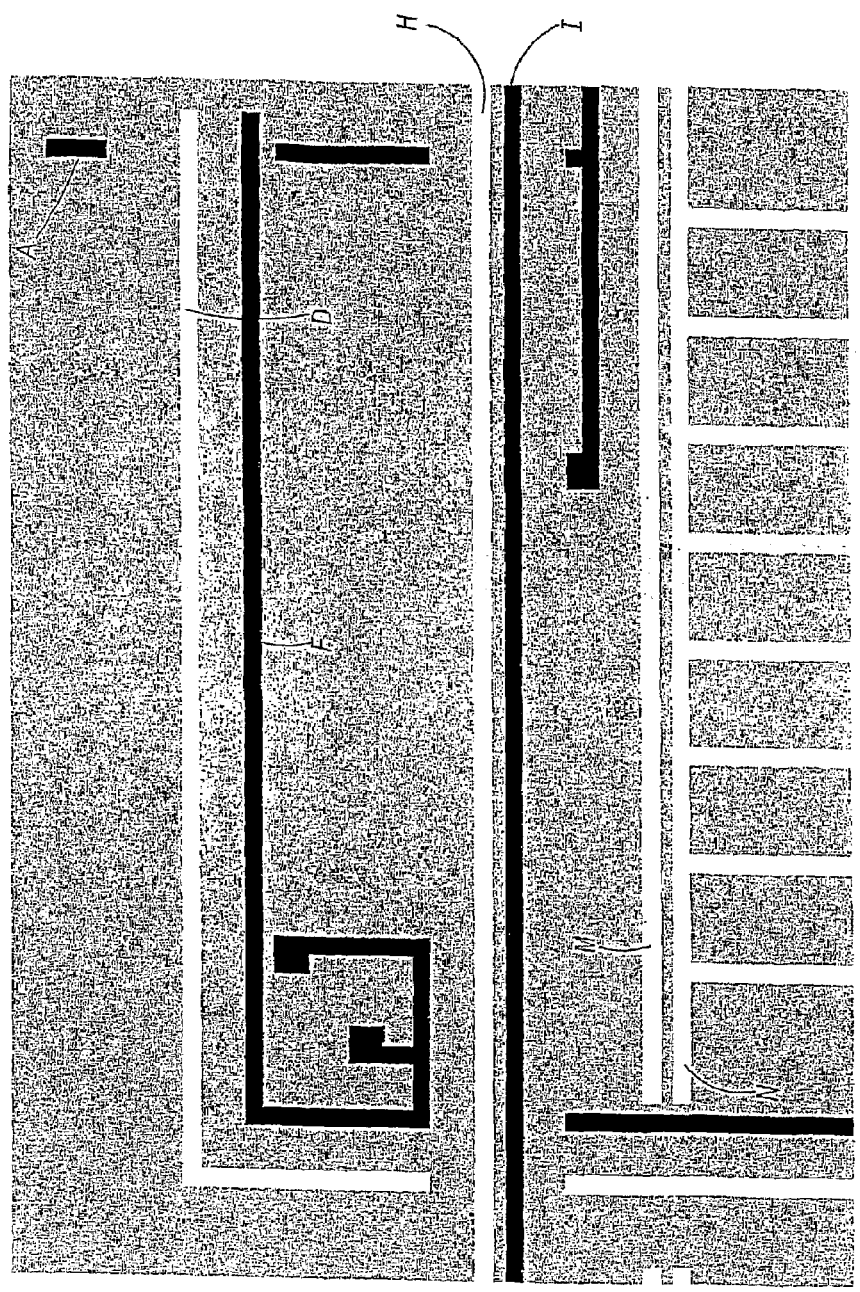
Figure 10:
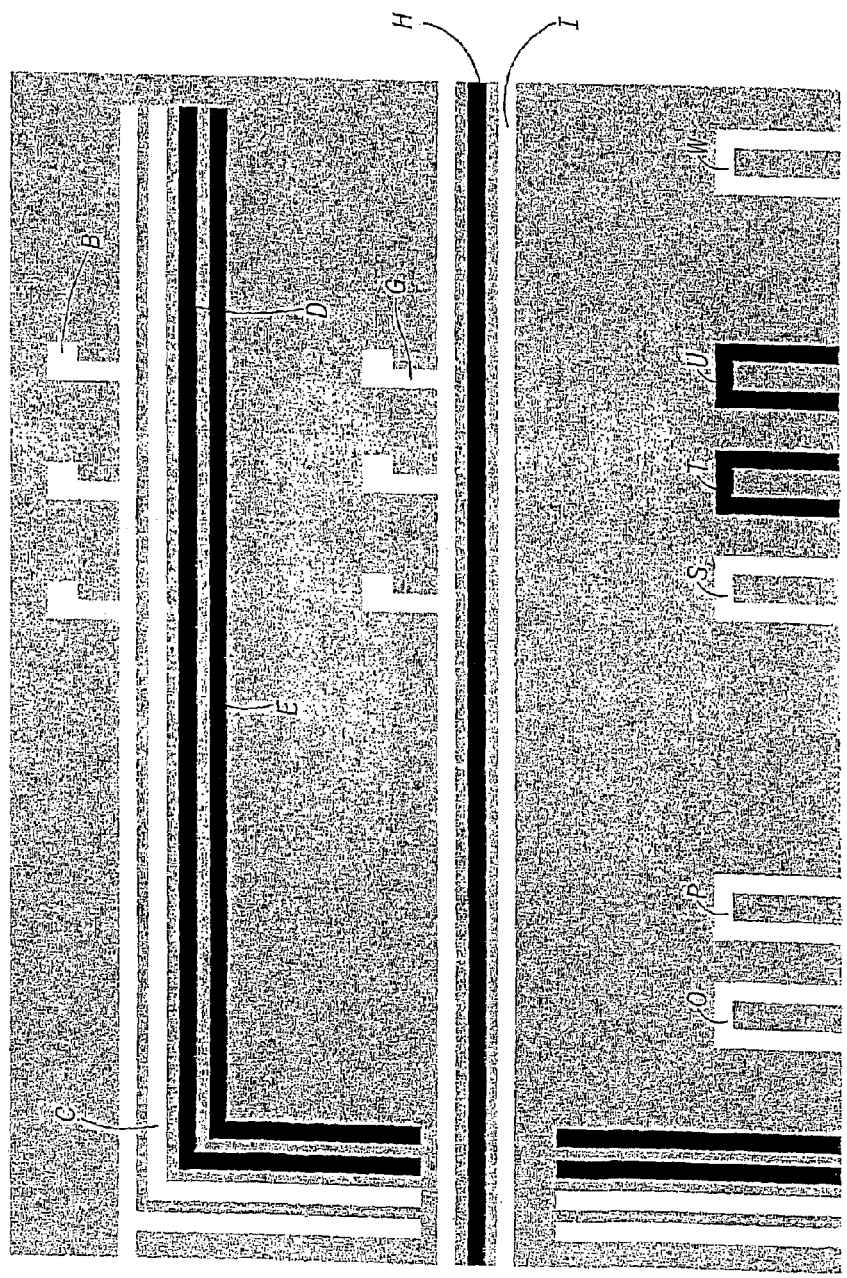
Figure 11:
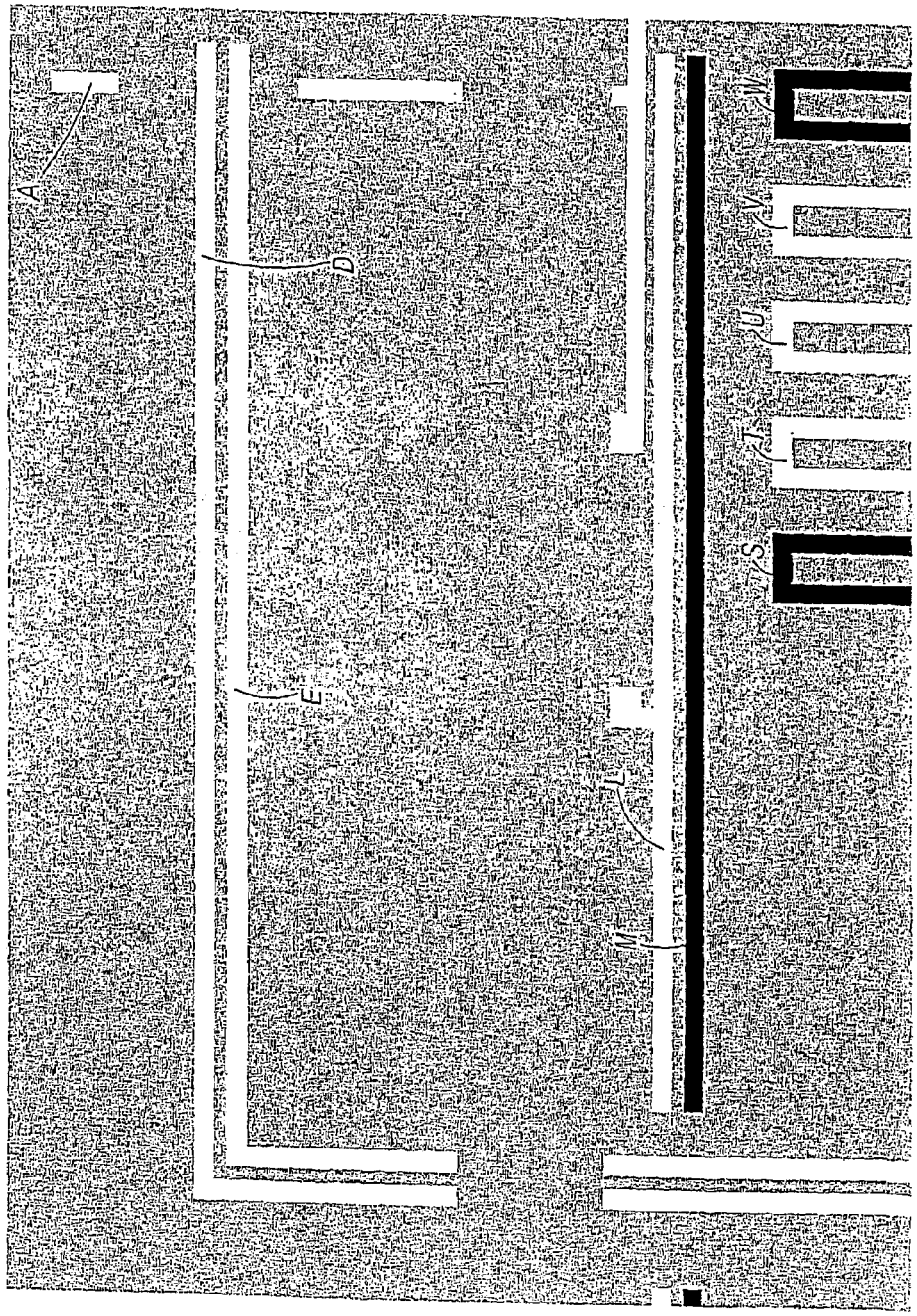
Figure 12:
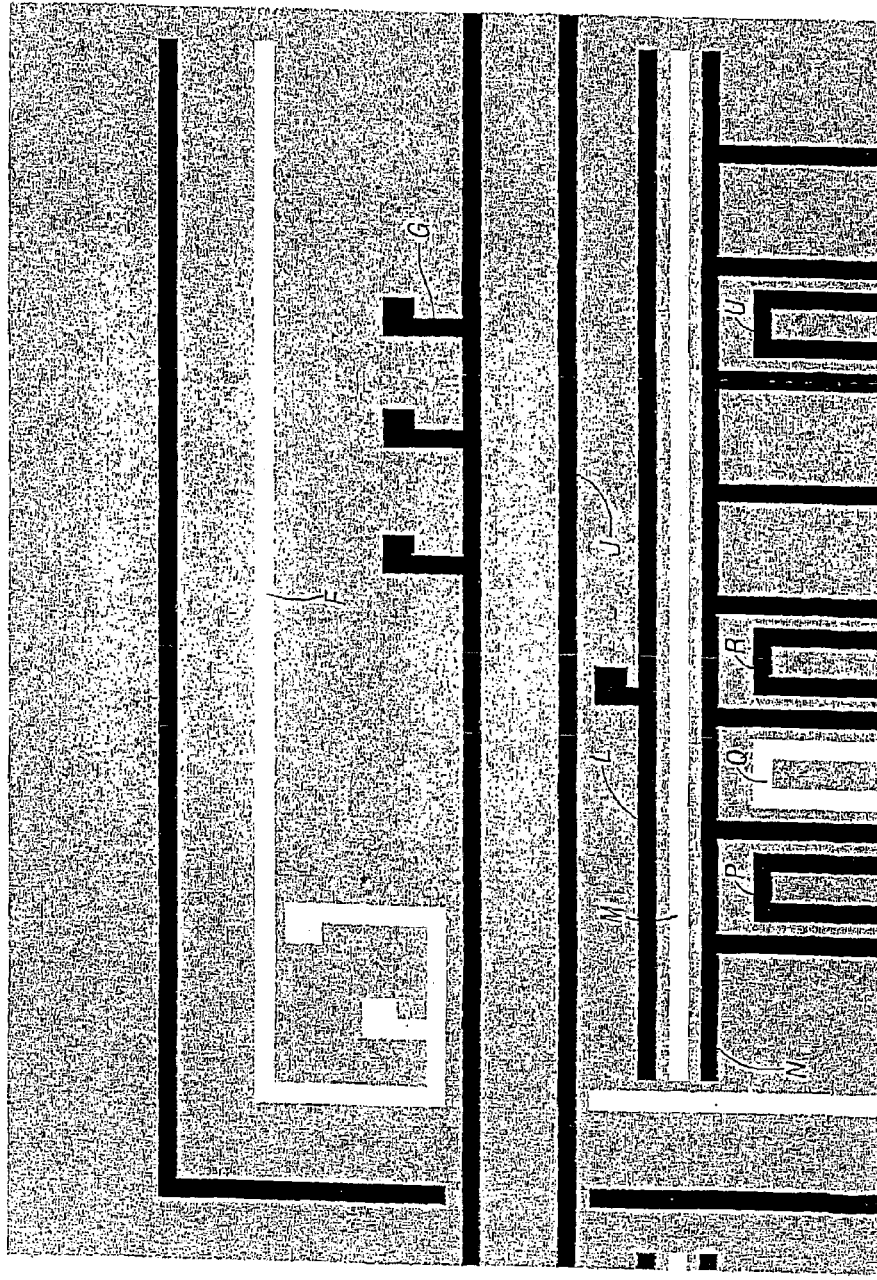
Figure 13:
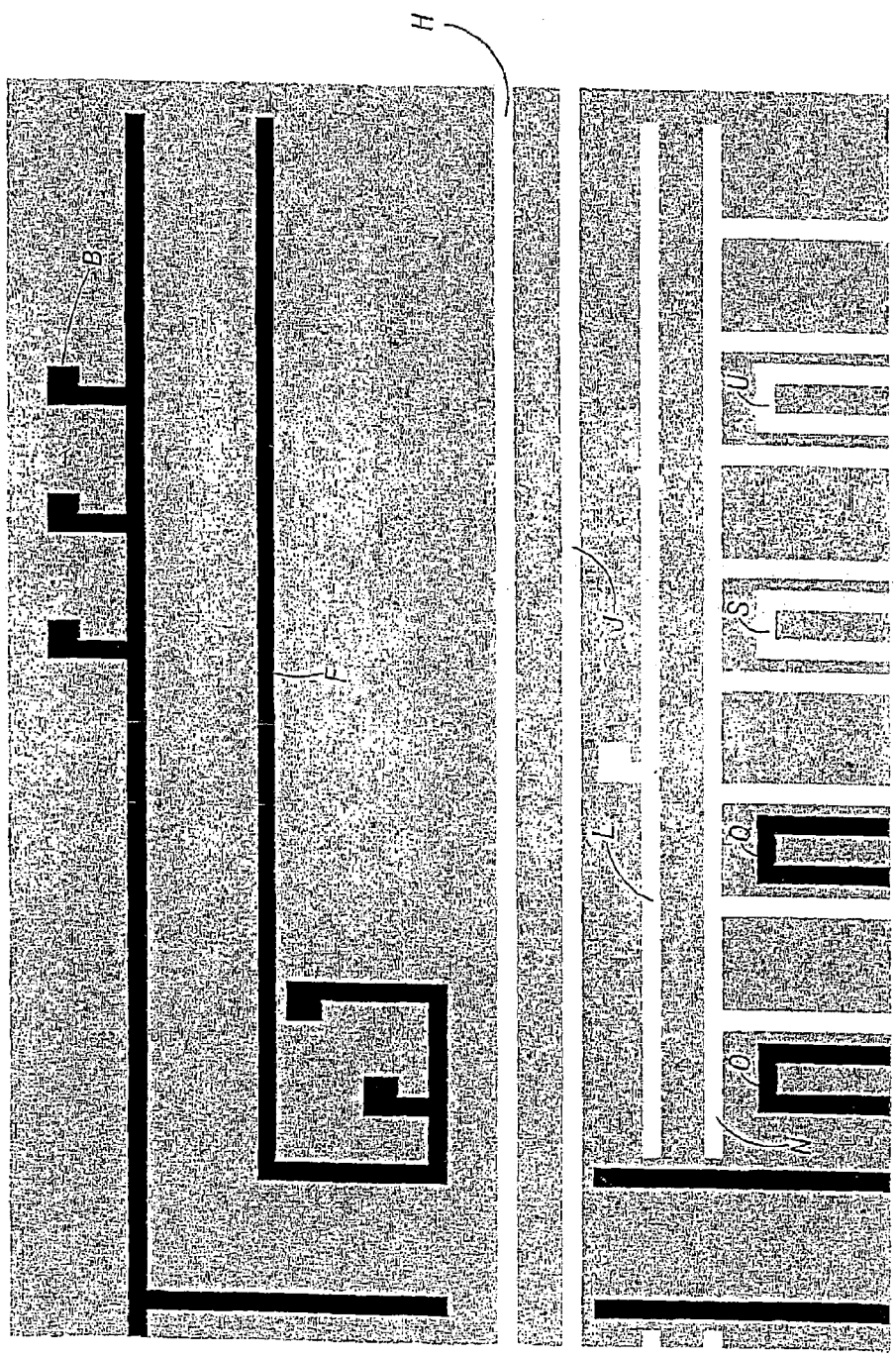
Figure 14:
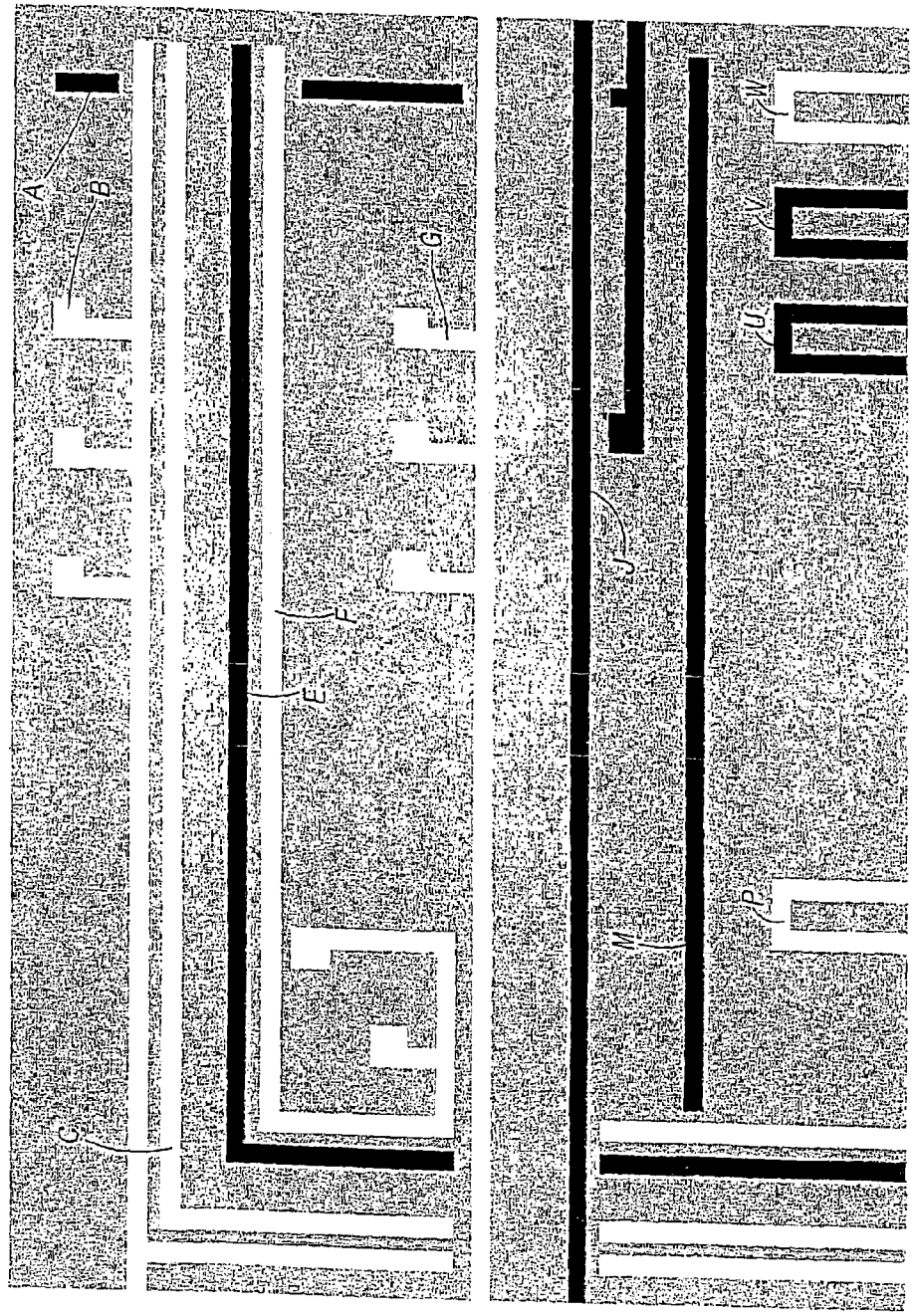
Figure 15:
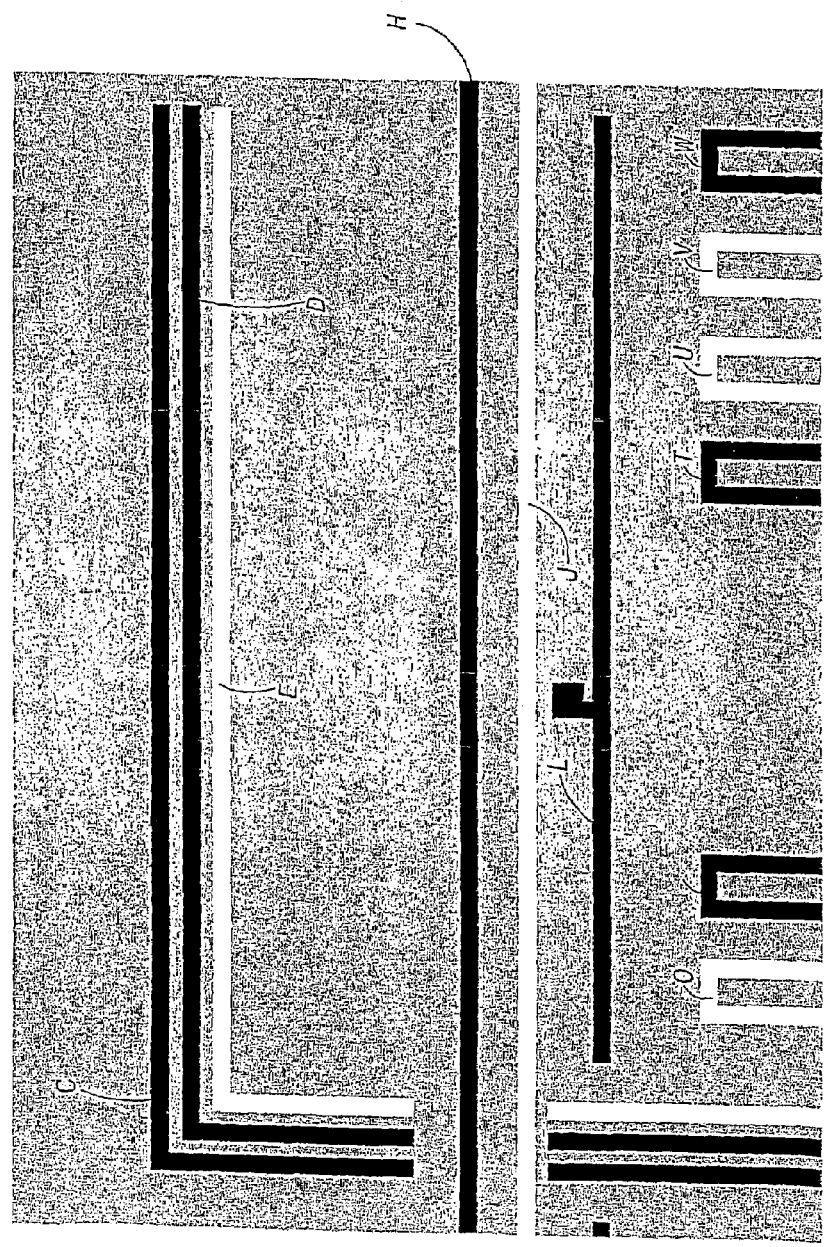

This image is formed by applying graphics operator splitbyG to the image 208 and to the image of FIG. 7 which corresponds to the vector 3.

In the image 210, the element A appears on its own since the only non-zero component of the result vector R123 is that which appears in the first column corresponding to element A.

It will be understood that by continuing implementation of the algorithm in this way, each of the elements of the circuit can be picked out individually.

The invention claimed is:

1. A method of picking out an integrated circuit element, the method comprising the steps of:
   a) from a model of the circuit, determining a set of vectors each corresponding to an instant in a theoretical operation of the circuit while a predetermined test sequence is being applied, the coefficients of each vector being representative of the state of a given set of circuit elements including the element that is to be picked out;
   b) comparing vectors to define a composite of logic operators applied to said vectors, the composite enabling the coefficient corresponding to said element that is to be picked out;
   c) taking images of the circuit in operation at instants corresponding to the vectors to which said composite of logic operators is applied; and
   d) graphically combining the taken images by applying a composite of graphics operators corresponding to said composite of logic operators.

2. A method of individualization according to claim 1, wherein step b) of defining a composite of logic operators comprises a recursive step of comparing a vector of a matrix and a result vector obtained from a prior comparison.

3. A method of individualization according to claim 2, wherein step b) of defining a composite of logic operators comprises generating a tree whose nodes are constituted by the results of the comparisons performed.

TABLE 6

| Element | A | B | C | D | E | F | G | H | I | J | L | M | N | O | P | Q | R | S | T | U | V | W | | |
|---|---|---|---|---|---|---|---|---|---|---|---|---|---|---|---|---|---|---|---|---|---|---|---|---|
| Vector 1 | N | B | G | B | G | G | N | B | B | G | G | G | G | N | G | G | G | B | N | G | N | N | state 1 | |
| R1 | N | | | | | N | | | | | | | | N | | | | | N | | N | N | N | compaN | gives R1 |
| R2 | | B | B | | B | B | | | | | | | | | | | | B | | | | | compaB | gives R2 |

TABLE 7

| R1 | | N | | | N | | | | N | | | | N | N | N | R1 | |
|---|---|---|---|---|---|---|---|---|---|---|---|---|---|---|---|---|---|
| Vector 2 | | B | | | B | | | | G | | | | B | B | G | State 2 | |
| R11 | | | | | | | | | | | | | | | | compaN | |
| R12 | | B | | | B | | | | | | | | B | B | | compaB | gives R12 |
| R13 | | | | | | | | | G | | | | | G | | compaG | |

TABLE 7.2

| R2 | | B | B | | B | B | | | | | | | B | | | R12 | | |
|---|---|---|---|---|---|---|---|---|---|---|---|---|---|---|---|---|---|---|
| State 2 | | N | G | | G | G | | | | | | | G | | | State 2 | | |
| R21 | | N | | | | | | | | | | | | | | compaN gives element 21 | B |
| R22 | | | | | | | | | | | | | | | | compaB | | |
| R23 | | | G | | G | G | | | | | | | G | | | compaG | | |

TABLE 8

| R4 | B | | B | | | | | | B | B | R12 | |
|---|---|---|---|---|---|---|---|---|---|---|---|---|
| Vector 3 | G | | N | | | | | | N | N | State 3 | |
| R121 | | | N | | | | | | N | N | compaN | |
| R122 | | | | | | | | | | | compaB | |
| R123 | G | | | | | | | | | | compaG gives element R123 | A |

4. A method of individualization according to claim 1, wherein said set of vectors is a set of binary vectors, the coefficients being representative of the logic states of the associated circuit element.

5. A method of individualization according to claim 1, wherein said set of vectors is a set of ternary vectors, in which the coefficients are representative of changes of logic state in the associated circuit element.

6. A method of individualization according to claim 1, wherein prior to step b) of defining a composite of logic operators, the method comprises a step of classifying the vectors so as to increase their diversity.

7. Apparatus for picking out an integrated circuit element, the apparatus comprising:

means for using a model of the circuit to determine a set of vectors each corresponding to an instant in a theoretical operation of the circuit while a predetermined test sequence is being applied, the coefficients of each vector being representative of the state of a given set of circuit elements including the element that is to be picked out;

means for comparing vectors to define a composite of logic operators applied to said vectors, the composite enabling the coefficient corresponding to said element that is to be picked out;

means for taking images of the circuit in operation at instants that correspond to the vectors on which said composite of logic operators is applied; and means for graphically combining the images taken by applying a composite of graphics operators corresponding to said composite of logic operators.

\* \* \* \* \*